United States Patent
Namba et al.

(10) Patent No.: US 7,805,265 B2
(45) Date of Patent: Sep. 28, 2010

(54) METHOD AND APPARATUS FOR MEASURING ELECTRIC CIRCUIT PARAMETERS

(75) Inventors: Akihiko Namba, Osaka (JP); Tetsuyoshi Ogura, Osaka (JP); Toru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 703 days.

(21) Appl. No.: 11/579,866

(22) PCT Filed: May 13, 2005

(86) PCT No.: PCT/JP2005/008782

§ 371 (c)(1),
(2), (4) Date: Dec. 11, 2006

(87) PCT Pub. No.: WO2005/111635

PCT Pub. Date: Nov. 24, 2005

(65) Prior Publication Data

US 2008/0004819 A1    Jan. 3, 2008

(30) Foreign Application Priority Data

May 14, 2004   (JP) .............................. 2004-144809

(51) Int. Cl.
*G01R 27/06*   (2006.01)
(52) U.S. Cl. ..................... 702/65; 702/91; 324/601; 324/647
(58) Field of Classification Search .................. 702/65, 702/91; 324/601, 647
See application file for complete search history.

(56) References Cited

U.S. PATENT DOCUMENTS 5,646,536 A * 7/1997 Ishihara ...................... 324/601
6,147,501 A   11/2000 Chodora (Continued)

FOREIGN PATENT DOCUMENTS

DE        195 27 730        2/1996

(Continued)

OTHER PUBLICATIONS

Ballo, David. "Improve Test Throughput for Duplexers and other Mulitport Devices," Hewlet Packard.*

(Continued)

*Primary Examiner*—Sujoy K Kundu
(74) *Attorney, Agent, or Firm*—Wenderoth, Lind & Ponack, L.L.P.

(57) ABSTRACT

A method for measuring electric circuit parameters of a 2-terminal circuit having first and second terminals, includes steps of: terminating one of the first and second terminals with a terminal impedance Z1, to measure reflection characteristics α1 for the other terminal; terminating one of the first and second terminals with a terminal impedance Z2 different from the terminal impedance Z1, to measure reflection characteristics α2 for the other terminal; terminating one of the first and second terminals with a terminal impedance Z3 different from the terminal impedances Z1 and Z2, to measure reflection characteristics α3 for the other terminal; and calculating electric circuit parameters of the 2-terminal circuit based on the resultant reflection characteristics α1, α2 and α3, whereby measuring electric circuit parameters, such as S-parameters, Z-parameters or the like, even of a DUT having a weak ground, in a simple way with high accuracy and low cost.

2 Claims, 20 Drawing Sheets

U.S. PATENT DOCUMENTS

| | | | |
|---|---|---|---|
| 6,421,624 | B1 | 7/2002 | Nakayama et al. |
| 6,701,265 | B2 * | 3/2004 | Hill et al. ...................... 702/91 |
| 2003/0171886 | A1 | 9/2003 | Hill et al. |
| 2003/0173978 | A1 | 9/2003 | Adamian et al. |

FOREIGN PATENT DOCUMENTS

| | | |
|---|---|---|
| DE | 198 28 682 | 3/1999 |
| DE | 103 08 280 | 11/2003 |
| WO | 02/23212 | 3/2002 |

OTHER PUBLICATIONS

European Search Report issued May 15, 2009 in European Application No. 05738965.2.

G. Carchon, et al., "Accurate Measurement and Characterization of Reciprocal 3-Ports, Application to CPW T-Junctions in Thin-Film Multi-Layer MCM-D", Microwave Conference, 2000 Asia-Pacific, IEEE, Dec. 3, 2000, pp. 453-456.

D. Allstot, et al., "Compact Model Generation for On-Chip Transmission Lines", IEEE Transactions on Circuits and Systems, Part I, Regular Papers, vol. 51, No. 3, Mar. 2004, pp. 459-470.

W. Fan et al., "Mixed-Mode S-Parameter Characterization of Differential Structures", Electronics Packaging Technology, 2003 5$^{th}$ Conference, Dec. 10, 2003, pp. 533-537.

Paul D. Teal et al., "Characterization of Balanced Transmission Line By Microwave Techniques", IEEE Transactions on Microwave Theory and Techniques, vol. 46, No. 12, Dec. 1998.

\* cited by examiner (a) S11

(b) S21

(a) S11

(b) S21

(a) S11

(b) S21

(a) S11

(b) S21

(a) S11

(b) S21

(a) S11

(b) S21

METHOD AND APPARATUS FOR MEASURING ELECTRIC CIRCUIT PARAMETERS

TECHNICAL FIELD

The present invention relates to a method and an apparatus for measuring electric circuit parameters, more specifically, to measurement of electric circuit parameters of N-terminal network (N is an integer of two or more) having a plurality of input/output terminals, thereby facilitating evaluation of SI (Signal Integrity), PI (Power Integrity) and EMI (Electromagnetic Interference).

BACKGROUND

Recently, mobile electronics, such as cellular phone, notebook computer, digital camera, and digital home appliances, such as digital television, DVD (Digital Video Disc) have been increasingly developed in performance and multi-function, requiring higher signal processing speed and signal transmission rate.

Since high-speed signals cannot be transmitted merely with simple wiring design, evaluation of SI is important. Further, superposition of high frequency noise onto power and ground lines may adversely affect operation of electronic parts, such as LSI, hence, evaluation of PI is also important. Furthermore, in a case of a designed ground is not very strong and no path for return current is ensured, common mode current flows through both of signal lines and the ground to generate unwanted radiation (EMI), resulting in electromagnetic interference in television and radio receiver or malfunction of other electronics. These SI, PI and EMI share common issues of a) taking a measure to speed up signals, and b) taking a measure under constraint on design of ground.

As to SI, for example, influence of parasitic impedance accompanied with wires and influence of signal reflection which may occur at input to electronic parts or at joint of wiring, such as via hole, are not regarded as a problem at a lower transmission speed, but will be of importance as speeding up of signals. To cope with this issue, envisaged is design of wiring in consideration of impedance by providing a stronger ground with a larger area. In practice, however, it is very difficult to provide such a stronger ground with a larger area under constraint on downsizing of hardware, high-density mounting, cost-cutting (e.g., the reduced number of layers in multi-layer board), and the like.

As to PI, there is a problematic phenomenon of so-called ground bounce, i.e., electric potential of ground being varying alternately. One factor of this phenomenon is that power and ground lines have a finite impedance (e.g., inductive impedance) and variation of voltage takes place when an AC signal flows. The variation of voltage of ground can be expressed by $L \cdot (dI/dt)$ using the finite inductive impedance L and a current I. This variation is increased with a higher speed and a higher frequency. A weaker ground has a larger impedance, thereby fomenting such a PI issue.

As to EMI, as described above, a main factor thereof is that no path for return current is ensured, which is closely related to strength of ground and frequency.

Measurement and evaluation of the above-mentioned SI, PI and EMI require a technique for measuring and evaluating transmission lines and, power and ground lines having a weak ground at a higher speed and a higher frequency.

Patent document 1 mentioned below relates to a proximity electromagnetic measurement technique, in which an electromagnetic probe is positioned close to electronic parts or transmission lines to measure a quantity of EMI radiated from electric circuits including transmission lines and, power and ground lines having a weak ground, In particular, arrangement of the probe close to power and ground lines enables indirect evaluation of PI.

Next, another technique for directly measuring impedance of transmission lines will be described below.

FIG. 17 is a block diagram showing an example of a conventional measurement system for electric circuit parameters. Here, used for DUT (Device Under Test) is a 2-terminal circuit 70 having a pair of input terminals 74a and 74b, and a pair of output terminals 75a and 75b.

FIG. 18A is a perspective view showing an example of the 2-terminal circuit 70. FIG. 18B is a cross sectional view along a longitudinal direction of a signal strip line 73. The 2-terminal circuit 70 includes an electrically insulating board 71, a ground pattern 72 located on a bottom face of the board 71, and the signal strip line 73 located on a top face of the board 71. The input terminal 74a is connected to one end of the signal strip line 73, and the input terminal 74b is connected to one end of the ground pattern 72. The output terminal 75a is connected to the other end of the signal strip line 73, and the output terminal 75b is connected to the other end of the ground pattern 72.

As shown in FIG. 17, the input terminals 74a and 74b of the 2-terminal circuit 70 are connected through a signal cable 81 to a network analyzer 80. The output terminals 75a and 75b are connected through another signal cable 82 to the network analyzer 80. The input terminal 74b and the output terminal 75b are grounded to keep a ground voltage.

The vector network analyzer (VNA) 80 can supply the DUT with a reference signal to measure both amplitude and phase of the signal passing through the DUT and amplitude and phase of the signal reflected from the DUT, finally, line characteristics of the DUT, such as S-parameters. Here, the reference signal is supplied through the signal cable 81 into the input terminals 74a and 74b, while measuring the passing signal outputted from the output terminals 75a and 75b of the 2-terminal circuit 70 using the interposing signal cable 82. At the same time, the reflecting signal returned from the input terminals 74a and 74b of the 2-terminal circuit 70 is measured using the interposing signal cable 81, resulting in S-parameters having a 2×2 matrix for the 2-terminal circuit 70.

FIG. 19 is a block diagram showing another example of a conventional measurement system for electric circuit parameters. Here, used for DUT is a 4-terminal circuit 70a having a pair of input terminals 74a and 74c, a pair of input terminals 74b and 74d, a pair of output terminals 75a and 75c and a pair of output terminals 75b and 75d, in which not only the signal strip line 73 of the 2-terminal circuit 70 shown in FIG. 18 but also the ground pattern 72 thereof is regarded as a kind of signal line.

FIG. 20A is a perspective view showing an example of the 4-terminal circuit 70a. FIG. 20B is a cross sectional view along a longitudinal direction of the signal strip line 73. The 4-terminal circuit 70a is configured by arranging two additional dummy metal plates 76 and 77 in parallel above and below the board 71 of the 2-terminal circuit 70 shown in FIG. 18.

The input terminal 74a is connected to one end of the signal strip line 73, and the input terminal 74b is connected to one end of the ground pattern 72. The input terminals 74c and 74d are connected to one ends of the dummy metal plates 76 and 77, respectively. The output terminal 75a is connected to the other end of the signal strip line 73, and the output terminal 75b is connected to the other end of the ground pattern 72. The output terminals 75c and 75d are connected to the other ends of the dummy metal plates 76 and 77, respectively.

As shown in FIG. 19, the input terminals 74a and 74c of the 4-terminal circuit 70a are connected through a signal cable 83 to a network analyzer 80. The input terminals 74b and 74d are connected through a signal cable 84 to the network analyzer 80. The output terminals 75a and 75c are connected through a signal cable 86 to the network analyzer 80. The output terminals 75b and 75d are connected through a signal cable 85 to the network analyzer 80. Accordingly, when a coaxial cable is used for each of the signal cables 83 to 86, the input terminal 74b and the output terminal 75b of the ground pattern 72 are connected via the cable core. The input terminals 74c and 74d and the output terminals 75c and 75d are grounded to keep a ground voltage.

Thus, in case of the DUT being the 4-terminal circuit 70a, S-parameters having a 4×4 matrix can be measured.

FIG. 21 a circuit diagram showing an example of a converter for converting a 4-terminal circuit into a 2-terminal circuit. An input balun 87 is connected to the input terminals 74a and 74b of the 4-terminal circuit 70a, and an output balun 88 is connected to the output terminals 75a and 75b, and the input terminals 74c and 74d and the output terminals 75c and 75d are grounded. Using this arrangement of the baluns 87 and 88 on input and output sides, four unbalanced signals can be converted into two balanced signals.

When this converter is configured on, e.g., a circuit simulator, the resultant S-parameters having a 4×4 matrix for the 4-terminal circuit 70a can be converted into other S-parameters having a 2×2 matrix for the input and output terminals of the 2-terminal circuit having the baluns 87 and 88. In actual measurement, on the other hand, a network analyzer or the like can measure S-parameters for the 2-terminal circuit into which the 4-terminal circuit is converted by this converter.

[PATENT DOCUMENT 1] JP-3394202, B

In such electromagnetic measurement with a probe as Patent Document 1, a spatially distributed electric field or magnetic field is observed. A measured value varies with dependence on a distance between the probe and a measuring object, hence, it is difficult to measure a absolute value. Further, the prove having a larger dimensions has higher sensitivity but lower planar resolution. Accordingly, in a case of fine patterns required for downsizing of hardware, it is difficult to identify a radiating portion.

Meanwhile, measurement of 2-terminal circuit using network analyzer, as shown in FIG. 17, is a relatively common technique. We could find out such problems as follows.

FIG. 22 is an illustrative view showing a current path in the measurement system of FIG. 17. When the ground pattern 72 of the 2-terminal circuit 70 is very strong, a current passing through the signal strip line 73, as shown by dashed line, will return via the ground pattern 72 to the input side. But when the ground pattern 72 is weak, part of the current passing through the signal strip line 73, as shown by double-dashed line, may leak to the output side, and flow through the ground line of the network analyzer 80, thereby causing an error of signal reflection characteristics in the input side.

The measurement of 2-terminal circuit in FIG. 17 is effective in a DUT having an ideal ground, whereas, in another DUT having a weak ground, S-parameters different from actual values will be obtained.

Measurement of 4-terminal circuit using network analyzer, as shown in FIG. 19, requires additional dummy metal plates 76 and 77 which can act as ground, resulting in complicated tools measurement, and increased cost and labor. Moreover, an additive parasitic impedance between the dummy metal plates 76 and 77 and the ground pattern 72 or the signal strip line 73 may cause an error of measurement.

As described above, the conventional measurement technique cannot achieve higher accuracy in any DUT having a weak ground.

Next, strength of ground will be discussed using an example of micro strip lines commonly used in a high frequency. Generally, in case of designing transmission lines composed of micro strip lines, it is assumed that the ground line is an ideal, i.e., very strong ground. In designing characteristic impedance of 50 ohm, for example, width of return line (opposite to ground) out of transmission lines, or thickness or permittivity of dielectric material will be modified.

In a case where a slit is formed across a current flow direction in the ground of the micro strip lines, the characteristic impedance will deviate from 50 ohm, because the ground dose not act as an ideal ground (electric conductor without voltage variation), in other words, the strong ground becomes weaker. The ideal strong ground can be made of an electric conductive plane having a larger area. But actual electronics have finite dimensions, therefore, the ground thereof is also finite. There is a possibility that some transmission lines are provided with strong grounds but other transmission lines are provided only with weak grounds.

As to weak grounds, in addition to the above-mentioned structure having a slit, width Wg of a ground is not very larger than width Ws of a return line out of transmission lines. For example, in case of Ws>5·Wg, the ground becomes weak.

Thus, when replacing a ground having a certain shape by an ideal ground, if characteristics, such as characteristic impedance or S-parameters, of the circuit is altered, it is determined that the ground is a weak ground.

An object of the present invention is to provide a method and an apparatus for measuring electric circuit parameters, which can measure electric circuit parameters, such as S-parameters, Z-parameters or the like, even of a DUT having a weak ground, in a simple way with high accuracy and low cost.

SUMMARY OF THE INVENTION

To achieve the object, a method for measuring electric circuit parameters of a 2-terminal circuit having first and second terminals, according to the present invention, includes steps of:

terminating one of the first and second terminals with a terminal impedance Z1, to measure reflection characteristics $\alpha 1$ for the other terminal;

terminating one of the first and second terminals with a terminal impedance Z2 different from the terminal impedance Z1, to measure reflection characteristics $\alpha 2$ for the other terminal;

terminating one of the first and second terminals with a terminal impedance Z3 different from the terminal impedances Z1 and Z2, to measure reflection characteristics $\alpha 3$ for the other terminal; and calculating electric circuit parameters of the 2-terminal circuit based on the resultant reflection characteristics $\alpha 1$, $\alpha 2$ and $\alpha 3$.

It is preferable in the present invention that each of the terminal impedances Z1, Z2 and Z3 is infinity, zero or characteristic impedance.

Further, it is preferable in the present invention that two or more of the terminal impedances Z1, Z2 and Z3 are configured of terminating resistors.

Further, it is preferable in the present invention that the method further includes calculating step for correcting imaginary component of impedance of a terminator used for the terminating resistor.

Further, it is preferable in the present invention that the method further includes steps of:

terminating the first terminal with a terminator having characteristic impedance, to measure reflection characteristics for the second terminal; and terminating the second terminal with the terminator having characteristic impedance, to measure reflection characteristics for the first terminal.

Moreover, a method for measuring electric circuit parameters of an N-terminal circuit (N is an integer of two or more) having first to N-th terminals, according to the present invention, includes steps of:

changing termination condition for any (N−1) terminals out of N terminals with respect to each of N·(N+1)/2 combinations, to measure each of N·(N+1)/2 reflection characteristics for the one residual terminal; and calculating electric circuit parameters of the N-terminal circuit based on the resultant reflection characteristics.

It is preferable in the present invention that each of any (N−1) terminals is terminated with one terminal impedance selected out of infinity, zero and characteristic impedance.

Further, it is preferable in the present invention that a terminator which terminates each of any (N−1) terminals includes a resistor having a resistance other than the characteristic impedance.

Further, it is preferable in the present invention that the method further includes calculating step for correcting imaginary component of impedance of the terminator.

Further, it is preferable in the present invention that S-parameters are calculated as electric circuit parameters.

Further, it is preferable in the present invention that the 2-terminal circuit includes an electrically insulating board, a first line located on a first principal surface of the board, and a second line located on a second principal surface of the board, wherein the first terminal is a pair of one ends of the first and second lines, and the second terminal is a pair of the other ends of the first and second lines.

Further, it is preferable in the present invention that at least one of the first and second lines is partially cut out or separated with respect to DC component, along the line.

Further, it is preferable in the present invention that one of the first and second lines is a power line, and the other is a ground line.

Further, it is preferable in the present invention that a capacitor is connected between the power line and the ground line.

Further, it is preferable in the present invention that, in a network including an electrically insulating board, a first line located on a first principal surface of the board, and second and third lines located on a second principal surface of the board, the first terminal is a pair of one ends of the second and third lines, and the second terminal is a pair of the other ends of the second and third lines.

Moreover, an apparatus for measuring electric circuit parameters of an N-terminal circuit (N is an integer of two or more) having first to N-th terminals, according to the present invention, includes:

a reference signal generator for generating a reference signal having a predetermined frequency and a predetermined amplitude;

a signal cable for supplying the N-terminal circuit with the reference signal;

a reflection characteristics measuring unit for measuring reflection characteristics of a signal reflected via the signal cable from the N-terminal circuit;

a memory for storing the measured value of the reflection characteristics measuring unit; and a calculation unit for calculating the measured value stored in the memory;

wherein termination condition for any (N−1) terminals out of N terminals of the N-terminal circuit is changed with respect to each of N·(N+1)/2 combinations, to measure each of N·(N+1)/2 reflection characteristics for the one residual terminal and to store the measured value in the memory, and the calculation unit calculates electric circuit parameters of the N-terminal circuit based on the resultant N·(N+1)/2 reflection characteristics.

Further, it is preferable in the present invention that, the termination condition for any (N−1) terminals is changed by electric switches with respect to each of N·(N+1)/2 combinations.

According to the present invention, after changing termination condition for one of the first and second terminals of the 2-terminal circuit to measure reflection characteristics for the other terminal, electric circuit parameters of the 2-terminal circuit are calculated based on the resultant reflection characteristics. Since no transmission characteristics throughout the 2-terminal circuit is measured, no measuring current leaks to the output side. Therefore, even in a case of the DUT having a weak ground, a current returns through the ground of the DUT to the input side, resulting in measurement of reflection characteristics with high accuracy.

In case of the 2-terminal circuit, electric circuit parameters having a 2×2 matrix, i.e., four variables must be determined. Since the electric circuit parameters constitutes a symmetric matrix on account of reversibility of circuit, all the variables can be determined using three simultaneous equations. Then, the three simultaneous equations can be obtained by changing terminal impedance with Z1, Z2 and Z3, respectively, while measuring respective reflection characteristics. The electric circuit parameters having a 2×2 matrix can be determined by solving these simultaneous equations.

Similarly, in the N-terminal circuit (N is an integer of two or more), electric circuit parameters (e.g., S-parameters) having an N×N matrix, i.e., $N^2$ variables must be determined. Since the electric circuit parameters constitutes a symmetric matrix on account of reversibility of circuit, all the variables can be determined using N·(N+1)/2 simultaneous equations. Then, the N·(N+1)/2 simultaneous equations can be obtained by changing termination condition for any (N−1) terminals out of N terminals with respect to each of N·(N+1)/2 combinations, while measuring each of N·(N+1)/2 reflection characteristics for the one residual terminal. The electric circuit parameters having an N×N matrix can be determined by solving these simultaneous equations.

Thus, the present invention can measure electric circuit parameters, such as S-parameters, Z-parameters or the like, even of a DUT having a weak ground, in a simple way with high accuracy and low cost.

BRIEF DESCRIPTION OF THE DRAWINGS

FIG. 20A is a perspective view showing an example of the 4-terminal circuit 70a.

Figure 1:
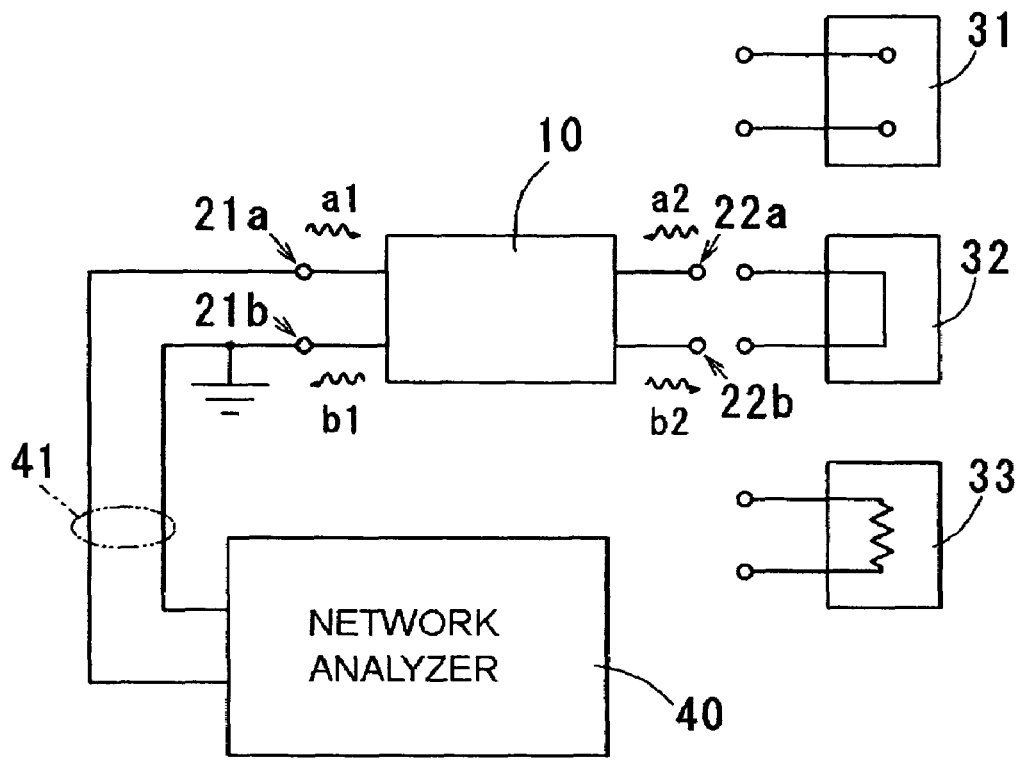
FIG. 1 is a block diagram showing a first embodiment according to the present invention.

EXPLANATORY NOTE 10, 10a, 10c 2-terminal circuit
10b 3-terminal circuit
11 board
12 ground pattern
12a, 12b, 12c slit
13, 13a, 13b, 14 signal strip line
21a, 21b, 22a, 22b, 23a, 23b terminal
31 to 35 termination element
40 vector network analyzer
41 signal cable
45 reference signal generator
46 impedance converter
47 directional coupler
48 heterodyne detector
49 A/D converter
50 calculation unit
51 memory
52 display unit
53 control panel

DETAILED DESCRIPTION OF THE INVENTION

Embodiment 1

FIG. 1 is a block diagram showing a first embodiment according to the present invention. Here, used for DUT (Device Under Test) is a 2-terminal circuit 10 having a pair of terminals 21a and 21b, and a pair of terminals 22a and 22b.

The terminals 21a and 21b of the 2-terminal circuit 10 are connected through a signal cable 41, such as coaxial cable, to a network analyzer 40. The terminals 22a and 22b are selectively connected with one of termination elements 31 to 33, each having predetermined impedances Z1, Z2 and Z3. The termination element 31 has impedance of infinity (Z1=∞), to set up so-called open termination condition. The termination element 32 has impedance of zero (Z2=0), to set up so-called short-circuit termination condition. The termination element 33 has an impedance equal to characteristic impedance (e.g., 50 ohm or 75 ohm) of the 2-terminal circuit 10 (Z3=Z0), to set up so-called matched termination condition. The terminal 21b is grounded to keep a ground voltage.

The vector network analyzer (VNA) 40 can supply the DUT with a reference signal to measure both amplitude and phase of the signal reflected from the DUT, finally, line characteristics of the DUT or electric circuit parameters, such as S-parameters.

Figure 2:
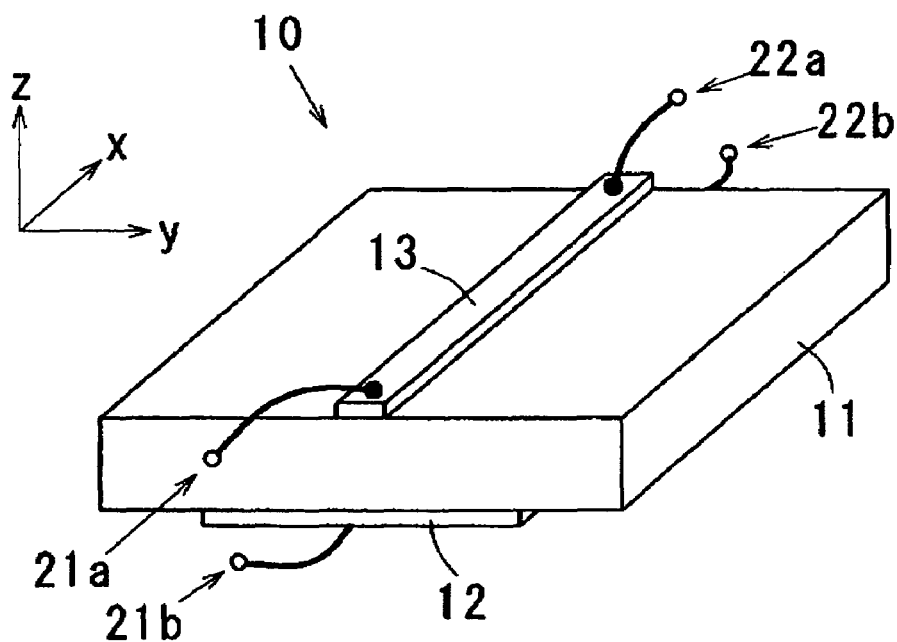
FIG. 2 is a perspective view showing an example of a 2-terminal circuit 10.

FIG. 2 is a perspective view showing an example of the 2-terminal circuit 10. The 2-terminal circuit 10 includes an electrically insulating board 11 made of dielectric material, a ground pattern 12 located on a bottom face of the board 11, and the signal strip line 13 located on a top face of the board 11. The terminal 21a is connected to one end of the signal strip line 13, and the terminal 21b is connected to one end of the ground pattern 12. The terminal 22a is connected to the other end of the signal strip line 13, and the terminal 22b is connected to the other end of the ground pattern 12.

Figure 3A:
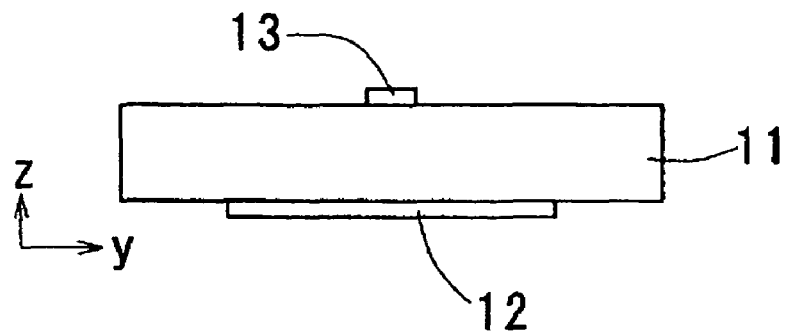
FIG. 3A is a front view of the 2-terminal circuit 10 in FIG. 2.
Figure 3B:
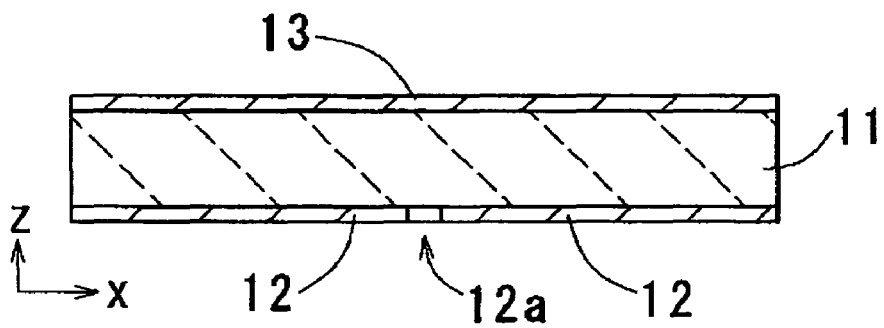
FIG. 3B is a cross sectional view along a longitudinal direction of a signal strip line 13.
Figure 3C:
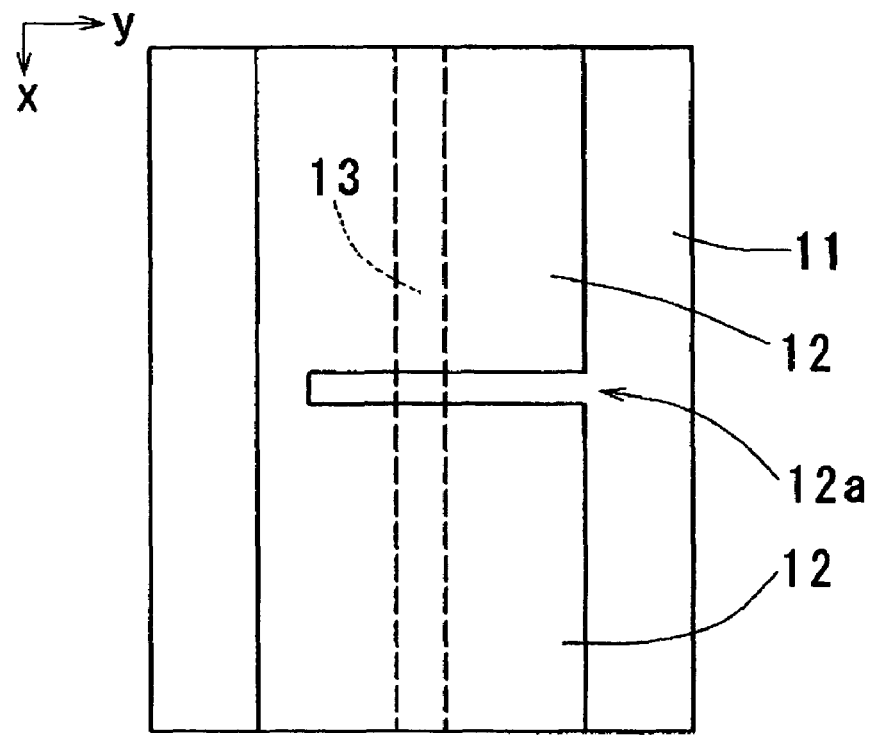
FIG. 3C is a bottom plan view showing a shape of a ground pattern 12.

FIG. 3A is a front view of the 2-terminal circuit 10 in FIG. 2. FIG. 3B is a cross sectional view along a longitudinal direction of the signal strip line 13. FIG. 3C is a bottom plan view showing a shape of the ground pattern 12. In this embodiment, a slit is formed across the signal strip line 13 in the ground pattern 12 to constitute a weak ground.

Next, procedure of measuring electric circuit parameters will be described below. First, the terminals 22a and 22b of the 2-terminal circuit 10 are set up to open termination condition. In this case, no connection of the terminals 22a and 22b may also be open. But the termination element 31 is preferably connected with them to set up the same measurement environment as in the other termination condition.

In this open condition, the network analyzer 40 supplies the terminals 21a and 21b with the reference signal via the signal cable 41, and then measures reflection characteristics α1 of the 2-terminal circuit 10, returning from the terminals 21a and 21b, for example, both amplitude and phase of the reflected signal. The reflection characteristics α1 is usually measured as complex value.

Next, the terminals 22a and 22b of the 2-terminal circuit 10 are connected with the termination element 32 having impedance of zero to set up short-circuit termination condition. In this condition, the network analyzer 40 supplies the terminals 21a and 21b with the reference signal via the signal cable 41, and then measures reflection characteristics α2 of the 2-terminal circuit 10, returning from the terminals 21a and 21b, for example, both amplitude and phase of the reflected signal. The reflection characteristics α2 is also usually measured as complex value.

Next, the terminals 22a and 22b of the 2-terminal circuit 10 are connected with the termination element 32 having characteristic impedance Z0 to set up matched termination condition. In this condition, the network analyzer 40 supplies the terminals 21a and 21b with the reference signal via the signal cable 41, and then measures reflection characteristics α3 of the 2-terminal circuit 10, returning from the terminals 21a and 21b, for example, both amplitude and phase of the reflected signal. The reflection characteristics α3 is also usually measured as complex value.

S-parameters of the 2-terminal circuit 10 is calculated based on the resultant reflection characteristics α1, α2 and α3. As shown in FIG. 1, defining amplitude a1 of incident wave and amplitude b1 of reflected wave at the terminal 21a, and amplitude a2 of incident wave and amplitude b2 of reflected wave at the terminal 22a, S-parameters of the 2-terminal circuit 10 can be expressed by a 2×2 matrix as the following equation (1). Relation between incident and reflected waves is given by the following equation (2).

[Formula 1]

$$S行列 = \begin{pmatrix} S11 & S12 \\ S21 & S22 \end{pmatrix} \quad (1)$$

$$\begin{pmatrix} b1 \\ b2 \end{pmatrix} = \begin{pmatrix} S11 & S12 \\ S21 & S22 \end{pmatrix} \begin{pmatrix} a1 \\ a2 \end{pmatrix} \quad (2)$$

Next, when the terminals 22a and 22b are connected with a termination element having a load impedance ZL, the following equation (3) is established by using reflection characteristics α and characteristic impedance Z0.

[Formula 2]

$$\frac{ZL-Z0}{ZL+Z0} \times S21^2 + \left(\frac{ZL-Z0}{ZL+Z0} \times S22 - 1\right) \times (\alpha - S11) = 0 \quad (3)$$

Next, in case of open termination condition, the following equation (4) is obtained by substituting ZL=∞ in equation (3). In case of short-circuit termination condition, the following equation (5) is obtained by substituting ZL=0 in equation (3). In case of matched circuit termination condition, the following equation (6) is obtained by substituting ZL=Z0 in equation (3).

[Formula 3]

$$\frac{ZL-Z0}{ZL+Z0} = 1 \Rightarrow S21^2 + (S22-1) \times (\alpha1 - S11) = 0 \quad (4)$$

$$\frac{ZL-Z0}{ZL+Z0} = -1 \Rightarrow S21^2 + (S22+1) \times (\alpha2 - S11) = 0 \quad (5)$$

$$\frac{ZL-Z0}{ZL+Z0} = 0 \Rightarrow \alpha3 = S11 \quad (6)$$

In a case of the 2-terminal circuit 10 being configured of passive elements, excluding active elements, such as amplifying device, the following equation (7) is established on account of reversibility of circuit.

[Formula 4]

$$S21=S12 \quad (7)$$

Here, unknown variables to be determined are four elements (S11, S12, S21, S22) in S-matrix. These variables can be calculated as the following equations (8) to (10) by solving the four simultaneous equations (4) to (7).

[Formula 5]

$$S11 = \alpha3 \quad (8)$$

$$S21 = S12 = \sqrt{\frac{2 \times (\alpha3 - \alpha2) \times (\alpha3 - \alpha1)}{\alpha2 - \alpha1}} \quad (9)$$

$$S22 = \frac{2 \times \alpha3 - \alpha2 - \alpha1}{\alpha2 - \alpha1} \quad (10)$$

The resultant S-parameters of the 2-terminal circuit 10 can be converted into other electric circuit parameters, such as H-parameters, Y-parameters, Z-parameters or the like, using predefined conversion formulas.

Figure 4:
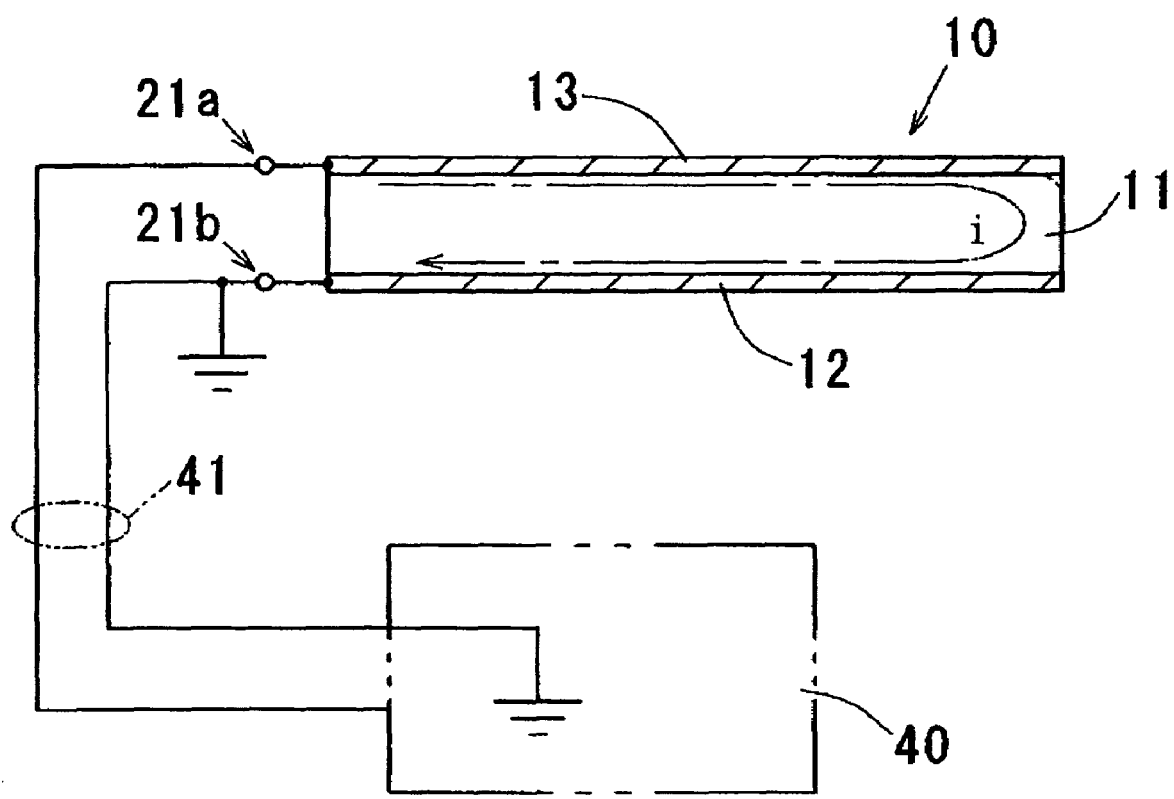
FIG. 4 is an illustrative view showing a current path in the measurement system of FIG. 1.

FIG. 4 is an illustrative view showing a current path in the measurement system of FIG. 1. In the invention, the input terminals 21a and 21b of the 2-terminal circuit 10 are electrically connected to the network analyzer 40, but the output terminals 22a and 22b are terminated with predefined termination condition without connection to the network analyzer 40. Therefore, even in the case of the weak ground pattern 12, as shown in FIG. 3c, current i passing through the signal strip line 13 returns via the ground pattern 12 into the input side, as shown by dashed line, without leakage to the output side. As a result, reflection characteristics can be measured with higher accuracy.

Figure 5:
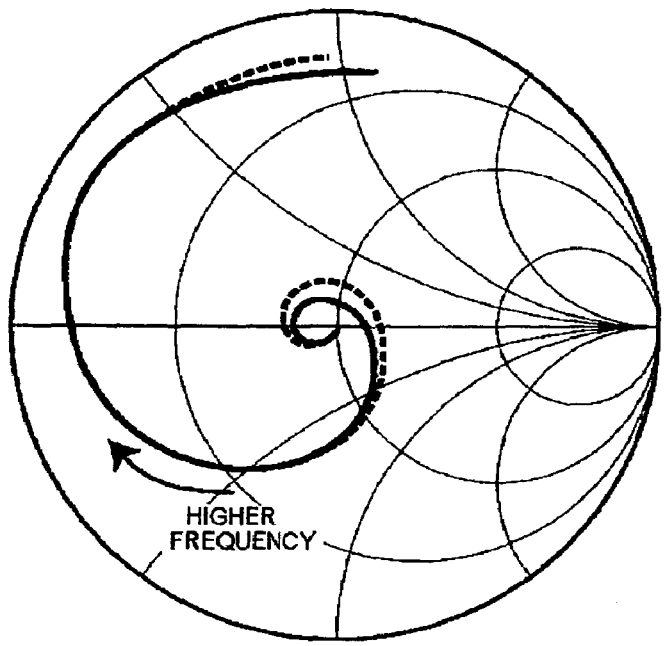
FIG. 5 is a graph showing an example of result of a measuring method according to the embodiment.
Figure 5:
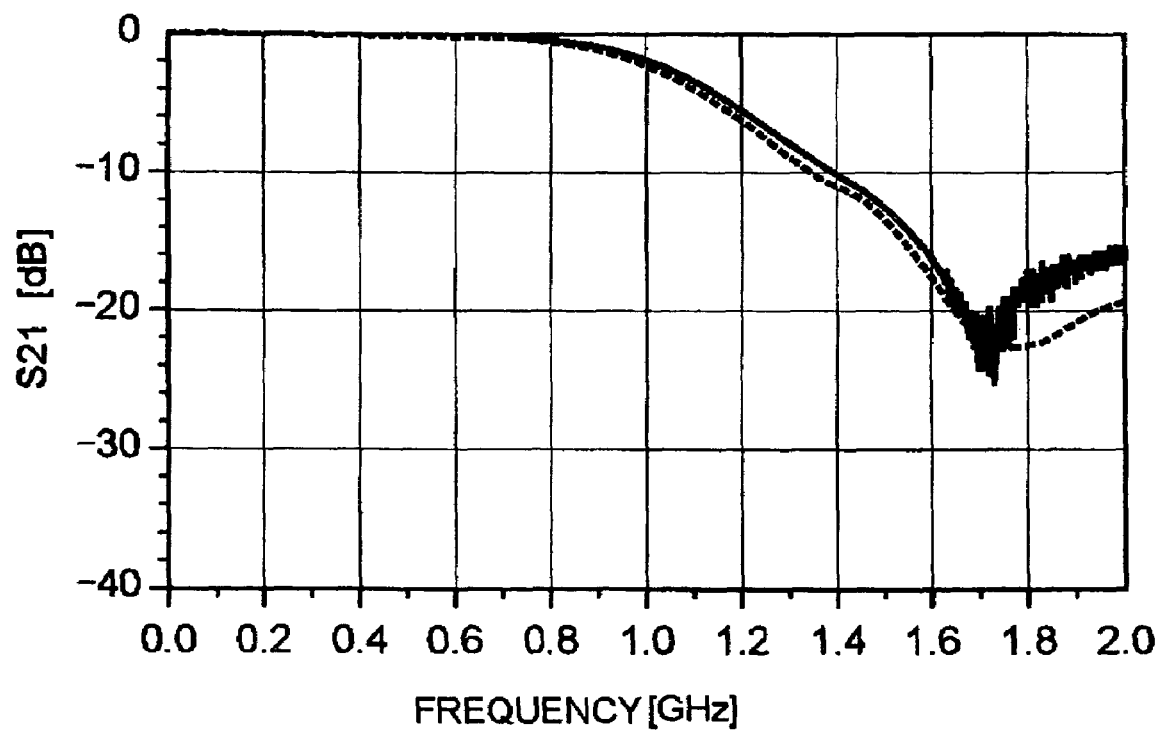
Figure 6:
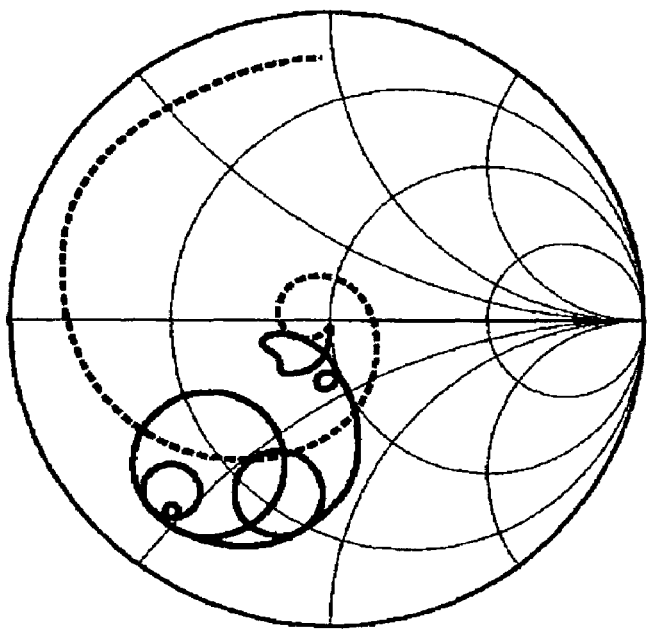
FIG. 6 is a graph showing an example of result of a conventional measuring method shown in FIG. 17.
Figure 6:
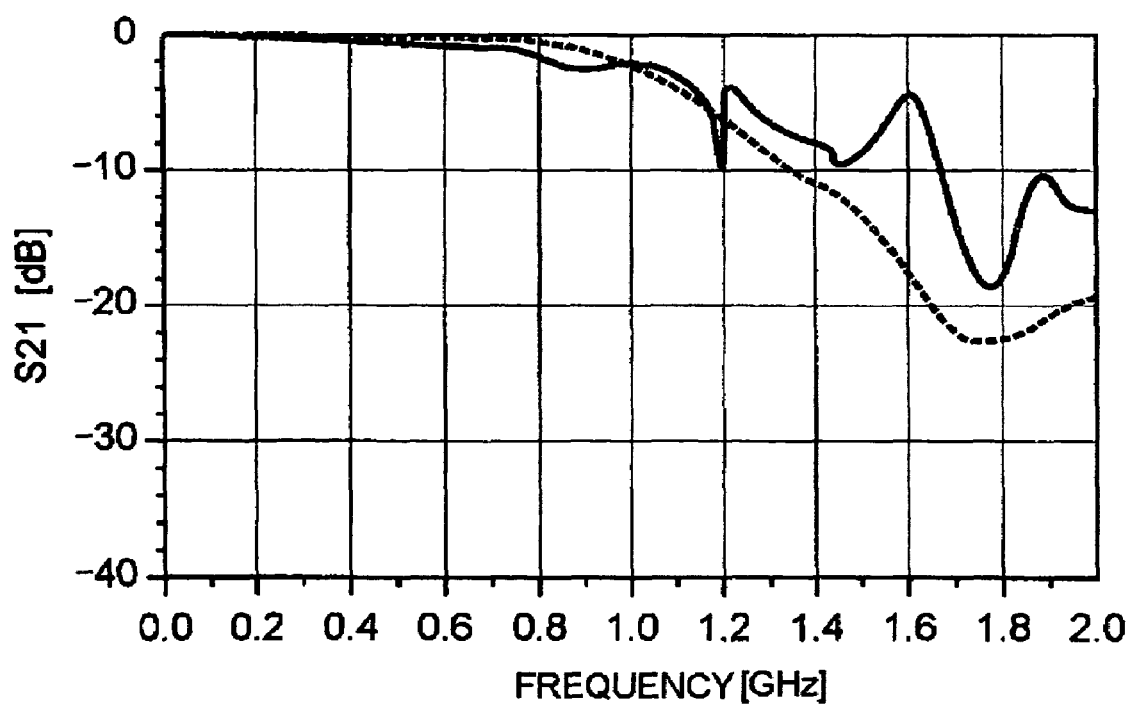
Figure 7:
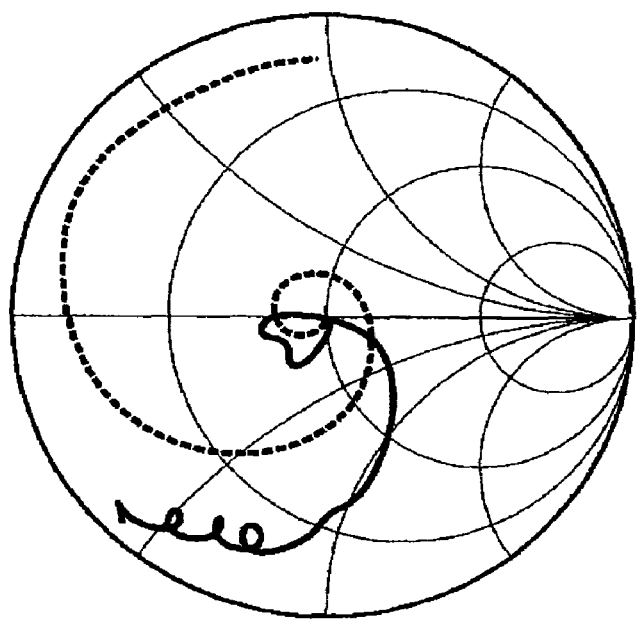
FIG. 7 is a graph showing an example of result of a conventional measuring method shown in FIG. 19.
Figure 7:
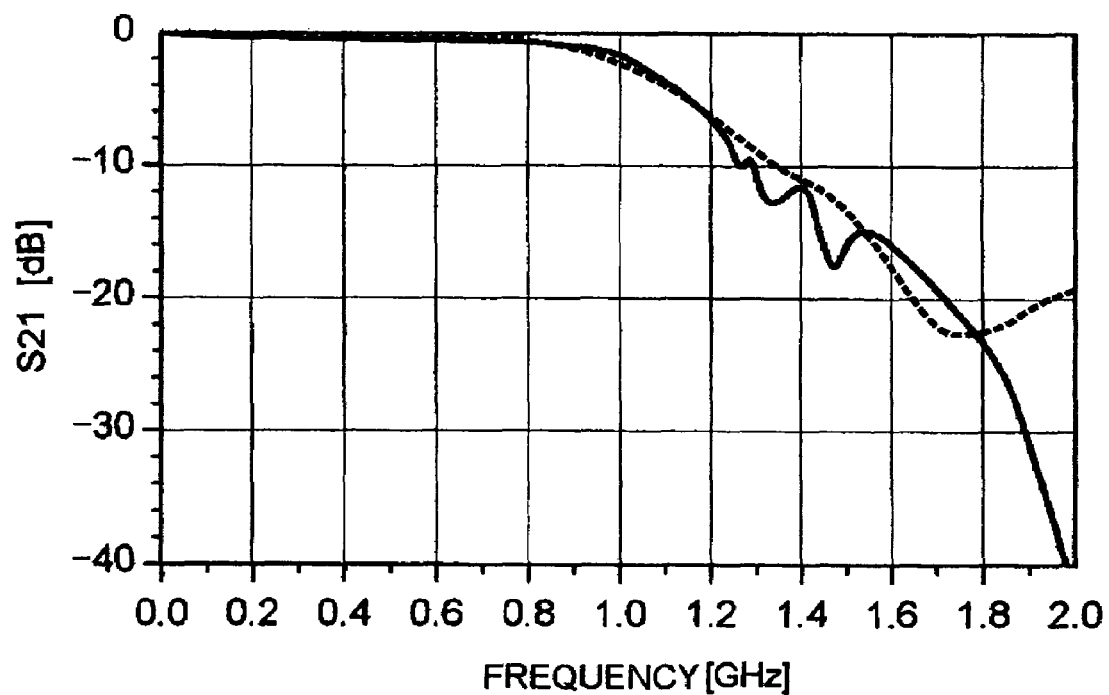
Figure 17:
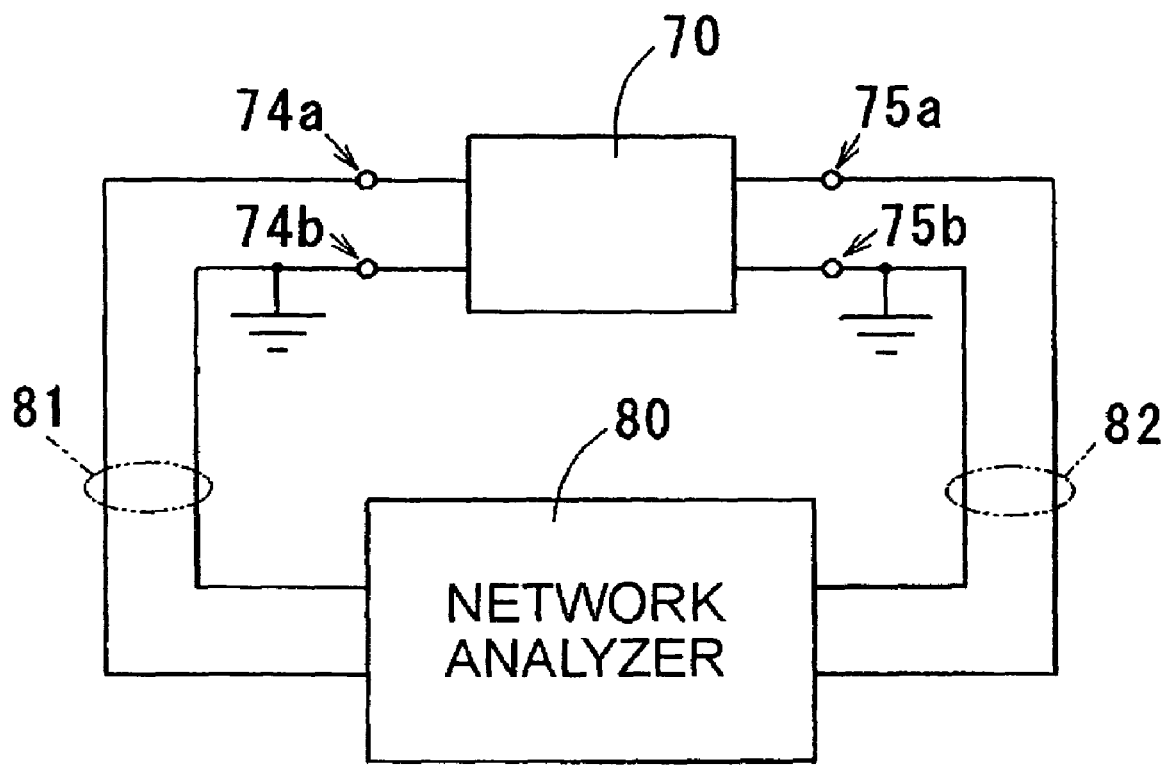
FIG. 17 is a block diagram showing an example of a conventional measurement system for electric circuit parameters.
Figure 18A:
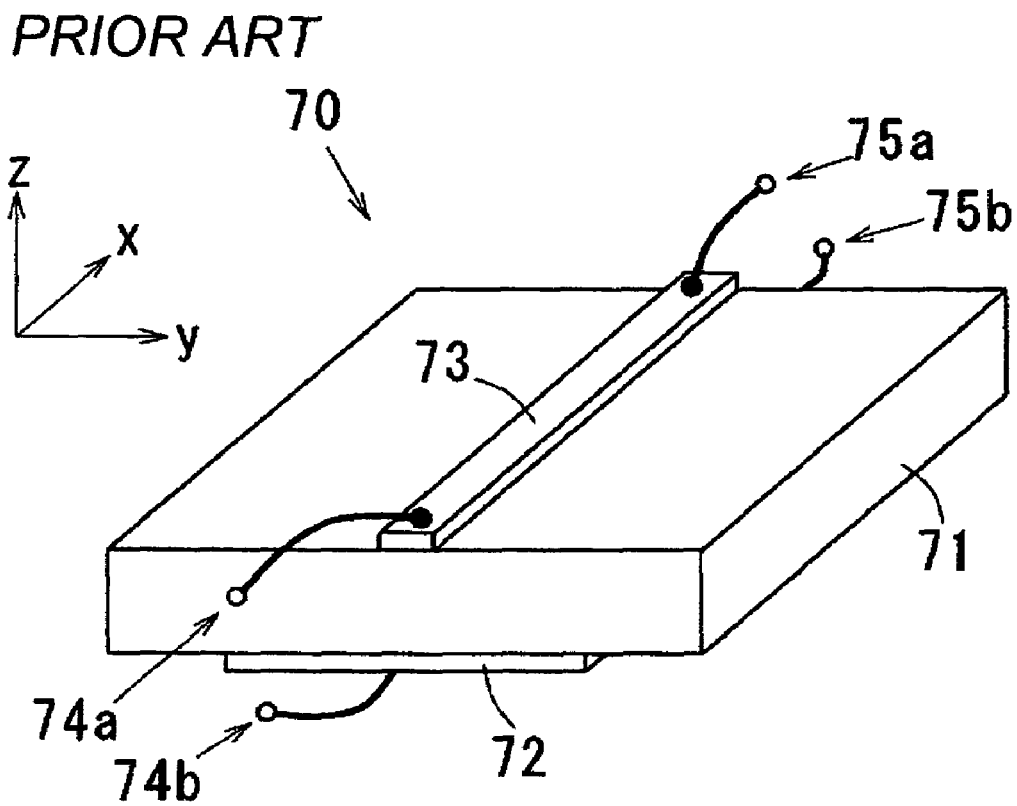
FIG. 18A is a perspective view showing an example of the 2-terminal circuit 70.
Figure 18B:
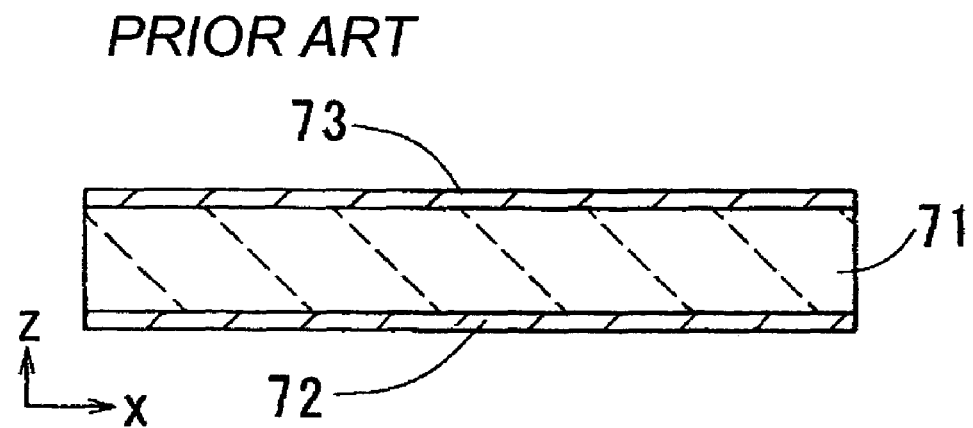
FIG. 18B is a cross sectional view along a longitudinal direction of a signal strip line 73.

FIG. 5 is a graph showing an example of result of a measuring method according to this embodiment. FIG. 6 is a graph showing an example of result of the conventional measuring method shown in FIG. 17. FIG. 7 is a graph showing an example of result of the conventional measuring method shown in FIG. 19. FIGS. 5(a), 6(a) and 7(a) are graphs showing S11 on a Smith chart, and FIGS. 5(b), 6(b) and 7(b) are graphs showing frequency characteristics of S21. In the Smith chart of FIGS. 5(a), 6(a) and 7(a), each of several circles having a center on the horizontal axis exhibits a constant real part of impedance. Each of circular arcs orthogonal to these circles exhibits a constant imaginary part of impedance, with higher frequency along a direction extending outward from the midpoint of the horizontal axis. Incidentally, in FIGS. 5(b), 6(b) and 7(b), the vertical axes show logarithmic scale (dB) of S21, and the horizontal axes show linear scale (GHz) of frequency.

In FIGS. 5 to 7, solid lines show actual values of the 2-terminal circuit 10 of FIG. 2, measured by the network analyzer 40. Broken lines show theoretical values of the 2-terminal circuit 10, calculated by electromagnetic simulation.

First, comparing the solid line with the broken line in FIG. 5, it can be seen that the result of the measuring method according to this embodiment almost coincides with the result of the simulation. Meanwhile, in FIG. 6, the solid line deviates remarkably from the broken line, which means that the conventional measuring method shown in FIG. 17 causes a large error of measurement. In FIG. 7, there is a relatively smaller error of measurement than that of FIG. 6. But the Smith chart of FIG. 7(a) exhibits a number of poles, which are assumedly caused by parasitic impedance of the additional metal plates 76 and 77.

Figure 8A:
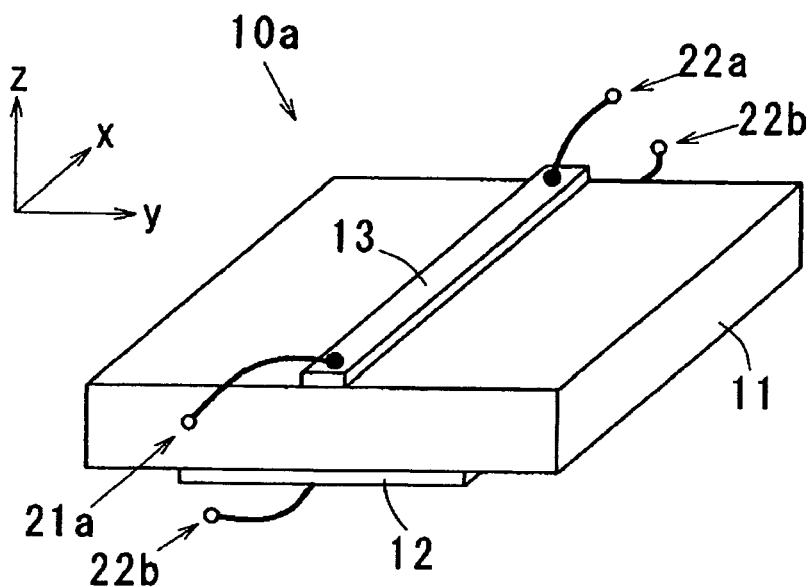
FIG. 8A is a perspective view showing another example of the 2-terminal circuit as DUT.
Figure 8B:
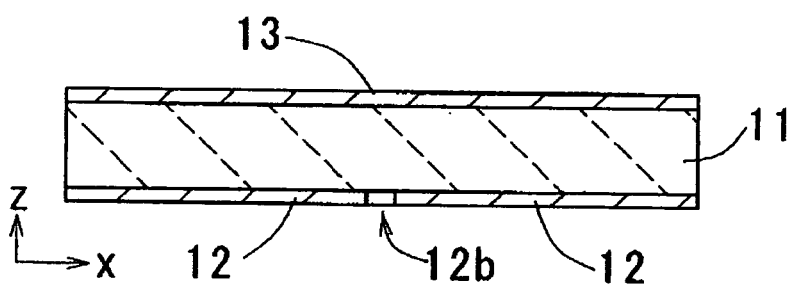
FIG. 8B is a cross sectional view along a longitudinal direction of a signal strip line 13.
Figure 8C:
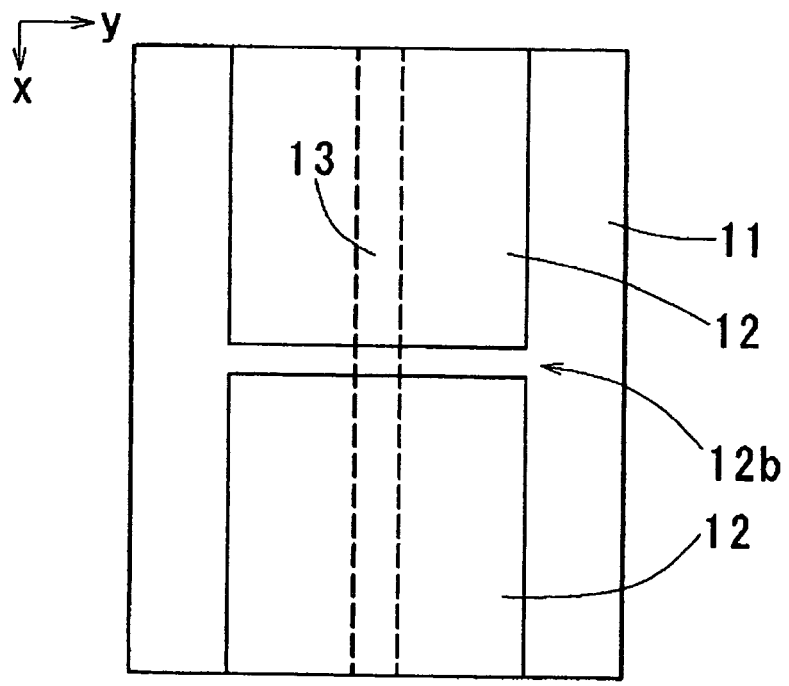
FIG. 8C is a bottom plan view showing a shape of a ground pattern 12.

FIG. 8A is a perspective view showing another example of the 2-terminal circuit as DUT. FIG. 8B is a cross sectional view along a longitudinal direction of the signal strip line 13. FIG. 8C is a bottom plan view showing a shape of the ground pattern 12. The 2-terminal circuit 10 includes the electrically insulating board 11 made of dielectric material, the ground pattern 12 located on the bottom face of the board 11, and the signal strip line 13 located on the top face of the board 11. The terminal 21a is connected to one end of the signal strip line 13, and the terminal 21b is connected to one end of the ground pattern 12. The terminal 22a is connected to the other end of the signal strip line 13, and the terminal 22b is connected to the other end of the ground pattern 12.

As shown in FIG. 8C, the ground pattern 12 is divided into two ground patterns 12 by a slit 12b formed across the signal strip line 13. The two ground patterns 12 are coupled to each other only by electric capacitance of the slit 12b, and DC conduction therebetween is perfectly cut off, resulting in a very weak ground.

Even in the 2-terminal circuit 10a having such separate grounds, electric circuit parameters can be measured by employing the same measuring method as in FIG. 1.

Figure 9:
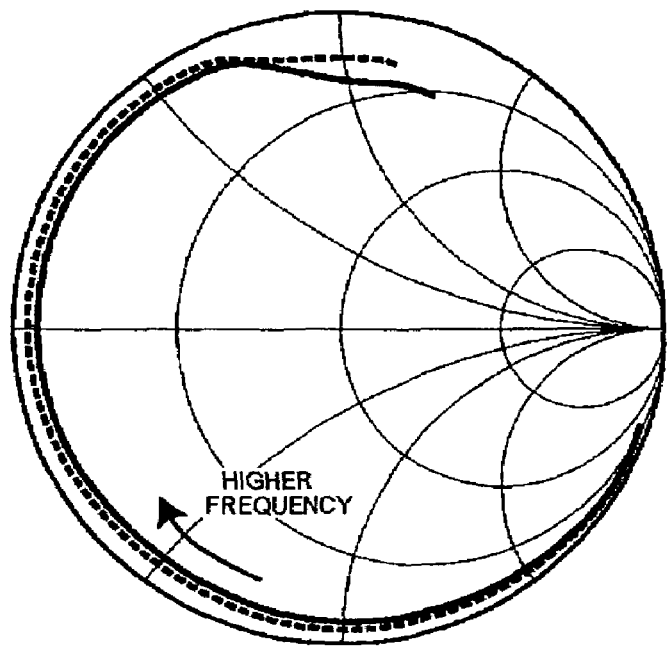
FIG. 9 is a graph showing an example of result of a measuring method according to the embodiment.
Figure 9:
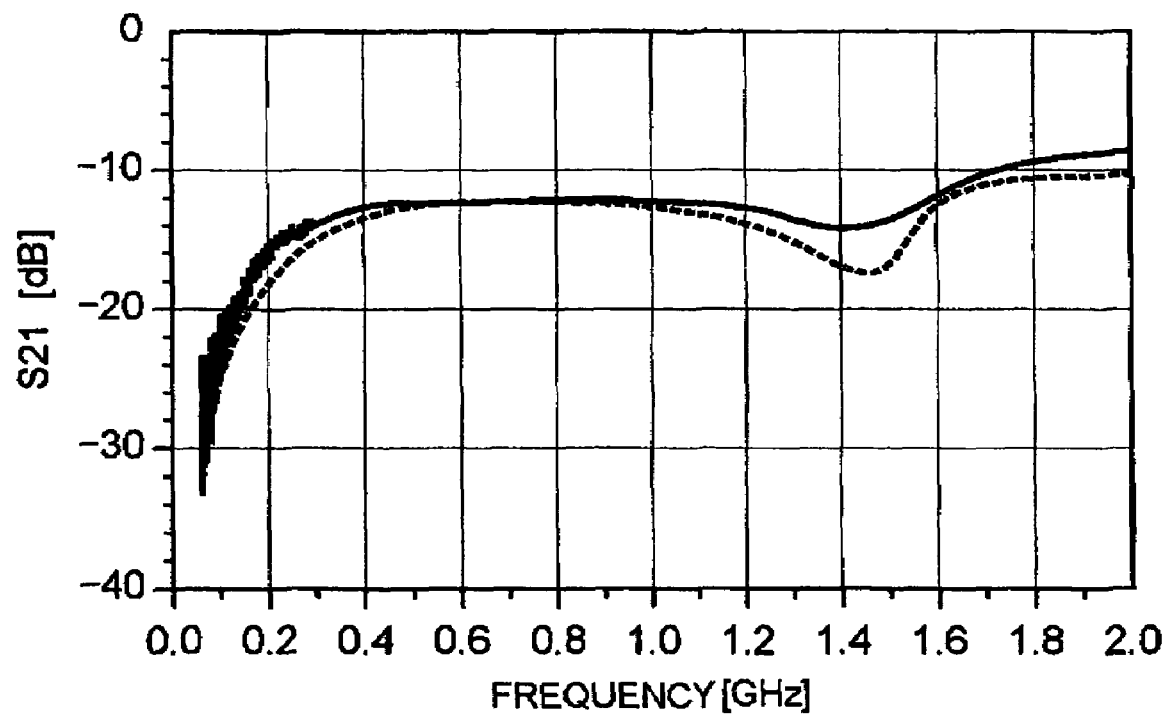
Figure 10:
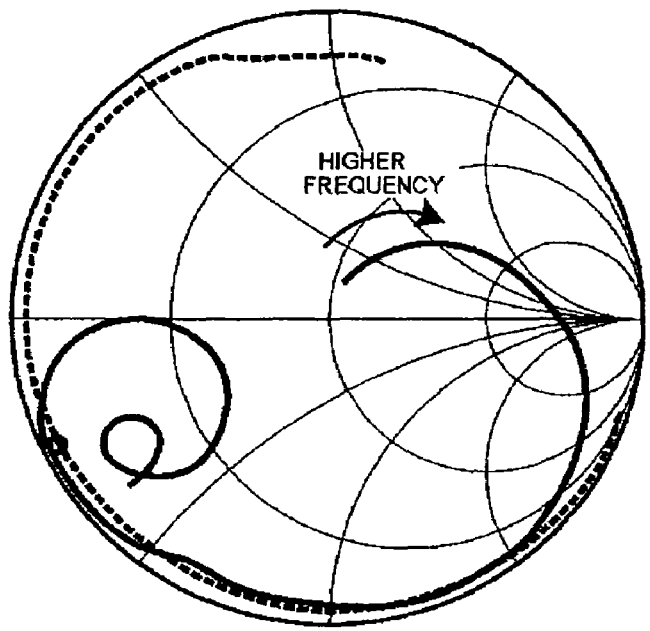
FIG. 10 is a graph showing an example of result of a conventional measuring method shown in FIG. 17.
Figure 10:
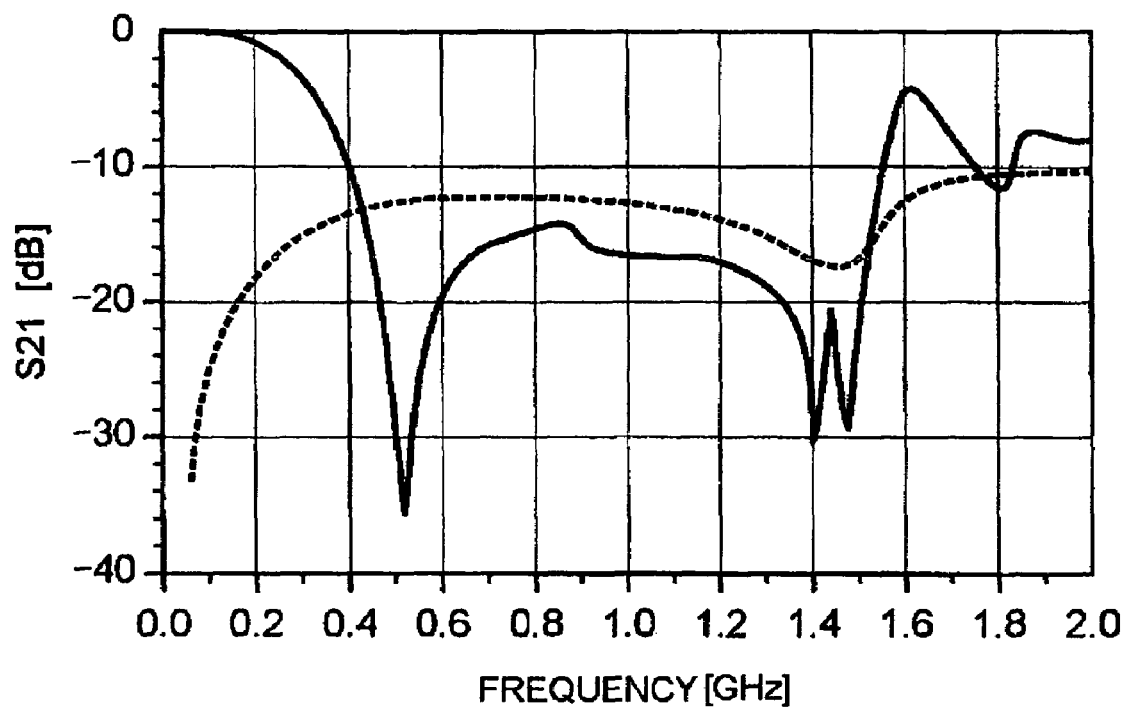
Figure 11:
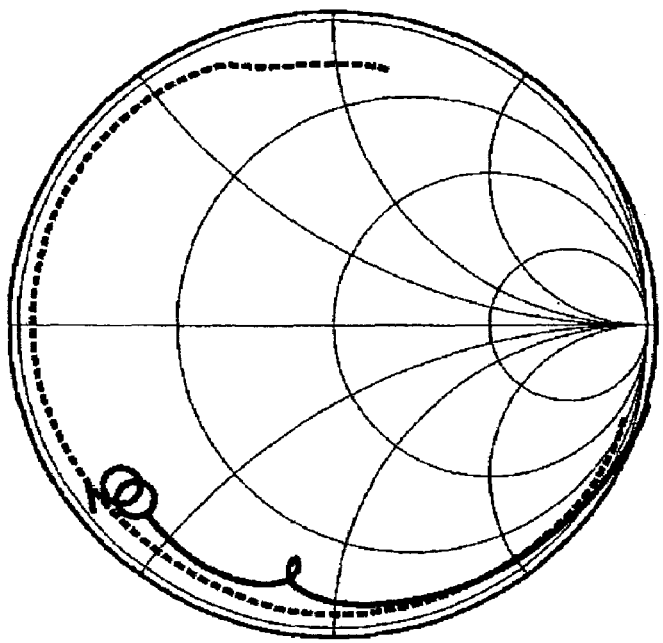
FIG. 11 is a graph showing an example of result of a conventional measuring method shown in FIG. 19.
Figure 11:
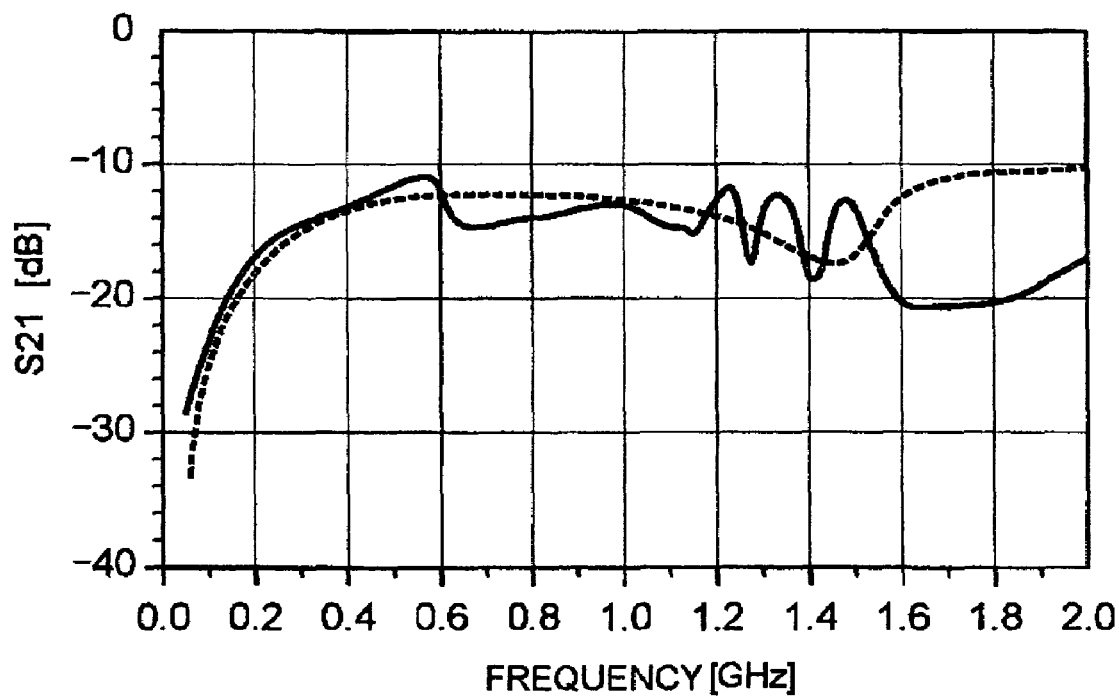

FIG. 9 is a graph showing an example of result of a measuring method according to this embodiment. FIG. 10 is a graph showing an example of result of the conventional measuring method shown in FIG. 17. FIG. 11 is a graph showing an example of result of the conventional measuring method shown in FIG. 19. FIGS. 9(a), 10(a) and 11(a) are graphs showing S11 on the Smith chart, and FIGS. 9(b), 10(b) and 11(b) are graphs showing frequency characteristics of S21. The Smith chart and frequency characteristics have the same format as in FIGS. 5 to 7.

In FIGS. 9 to 11, solid lines show actual values of the 2-terminal circuit 10a of FIG. 8, measured by the network analyzer 40. Broken lines show theoretical values of the 2-terminal circuit 10a, calculated by electromagnetic simulation.

Comparing the solid line with the broken line in FIG. 9, it can be seen that the result of the measuring method according to this embodiment almost coincides with the result of the simulation. Incidentally, frequency of about 0.3 GHz or below is cut off due to DC separation of the ground pattern.

In FIG. 10, however, the solid line deviates remarkably from the broken line, in particular, frequency of about 0.3 GHz or below is not cut off, and leakage of measuring current to the output side largely affects the result. In addition, serial resonant peaks around 0.5 GHz, 1.4 GHz, and 1.5 GHz, and parallel resonance peaks around 1.6 GHz take place, which means that the conventional measuring method shown in FIG. 17 causes a large error of measurement.

Further, in FIG. 11, there is a relatively smaller error of measurement than that of FIG. 10. But the Smith chart of FIG. 11(a) exhibits a number of poles, which are assumedly caused by parasitic impedance of the additional metal plates 76 and 77 like FIG. 7(a).

Thus, in the measuring method according to this embodiment, no measuring current leaks to the output side. Therefore, even in a case of the DUT having a weak ground, measurement with high accuracy can be realized. In addition, neither special tool nor dummy ground is required, and a relatively inexpensive vector network analyzer for 2 terminals can be employed, thereby curtailing cost of measurement.

Incidentally, in the above-description, each reflection characteristics is measured by changing the termination condition of the 2-terminal circuit in sequence of open, short-circuit and matched termination condition. But changing of the termination condition may be in random order, enough to obtain the three reflection characteristics α1, α2 and α3.

Further, terminal impedances Z1, Z2 and Z3 of the termination elements 31 to 33 are infinity, zero and characteristic impedance, respectively, in the above-description. But these terminal impedances may be finite and different from each other to calculate electric circuit parameters by calculating simultaneous equations. In particular, the termination element 31 having impedance of infinity or zero is easily affected by external electromagnetic noise, and also is likely to emit electromagnetic radiation, hence, it is preferably replaced with another termination element having finite impedance.

Furthermore, in a case where terminal impedances Z1, Z2 and Z3 of the termination elements 31 to 33 are expressed as real part, that is, resistance, substitution of real value of the resistance for the load ZL enables simultaneous equations to be calculated. In particular, usage of smaller chip parts as termination element facilitates measurement of electric circuits inside small-sized electronics, such as cellular phone.

In the above-description, terminal impedances Z1, Z2 and Z3 of the termination elements 31 to 33 are used in combination of infinity, zero and characteristic impedance. But it would be difficult to produce a terminator having impedance of perfect infinity, zero or characteristic impedance. Therefore, in order to achieve more accurate measurement, it is preferable that each impedance of terminators is accurately measured as complex value, and used for the value ZL. Thus, even in a case of using terminators having lower accuracy, such as commercially available chip parts, accurate measurement can be performed, thereby curtailing cost of measurement.

Further, in order to determine three unknown variables in the 2-terminal circuit, measurement with three termination conditions is enough on account of reversibility of circuit. But measurement with four or more termination conditions and application of fitting calculation may improve accuracy of measurement.

Embodiment 2

Figure 12:
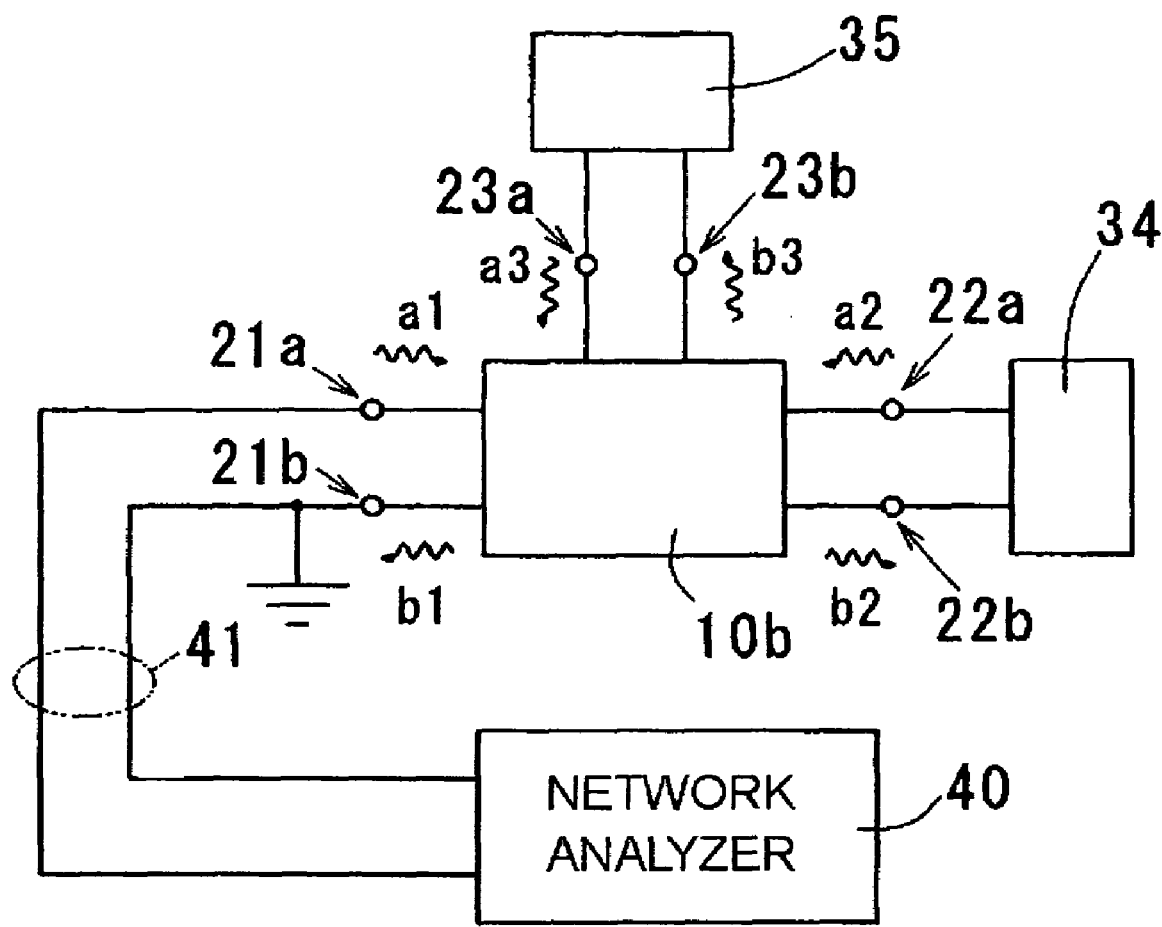
FIG. 12 is a block diagram showing a second embodiment according to the present invention.

FIG. 12 is a block diagram showing a second embodiment according to the present invention. Here, used for DUT is a 3-terminal circuit 10b having a pair of terminals 21a and 21b, a pair of terminals 22a and 22b, and a pair of terminals 23a and 23b.

The terminals 21a and 21b of the 3-terminal circuit 10b are connected through a signal cable 41, such as coaxial cable, to a network analyzer 40. The terminals 22a and 22b are selectively connected with a termination element 34 having predetermined impedance. The terminals 23a and 23b are selectively connected with a termination element 35 having predetermined impedance. The termination elements 34 and 35, like in FIG. 1, have impedance of infinity, impedance of zero, characteristic impedance of the 3-terminal circuit 10b, or other finite impedance. The terminal 21b is grounded to keep a ground voltage.

The vector network analyzer (VNA) 40 can supply the DUT with a reference signal to measure both amplitude and phase of the signal reflected from the DUT, finally, line characteristics of the DUT or electric circuit parameters, such as S-parameters.

Figure 13A:
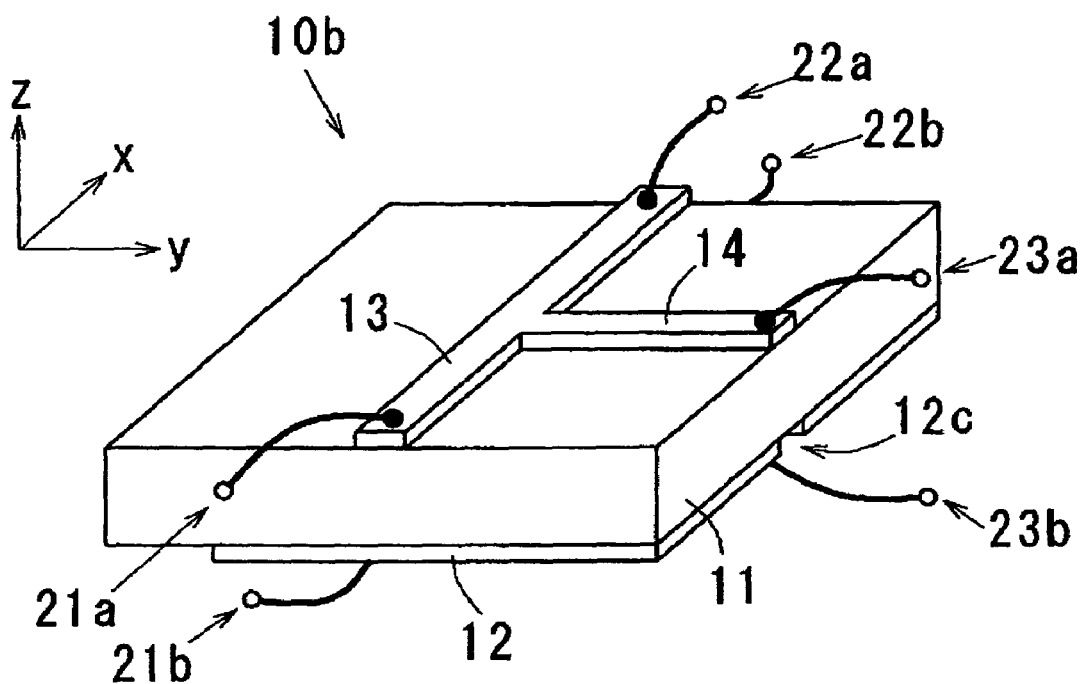
FIG. 13A is a perspective view showing an example of a 3-terminal circuit 10b.
Figure 13B:
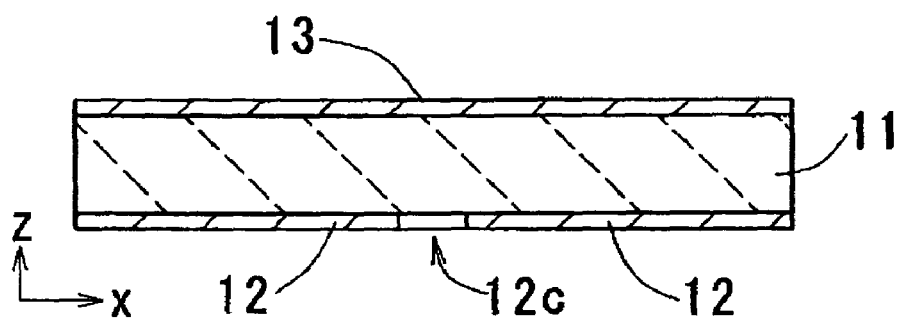
FIG. 13B is a cross sectional view along a longitudinal direction of a signal strip line 13.
Figure 13C:
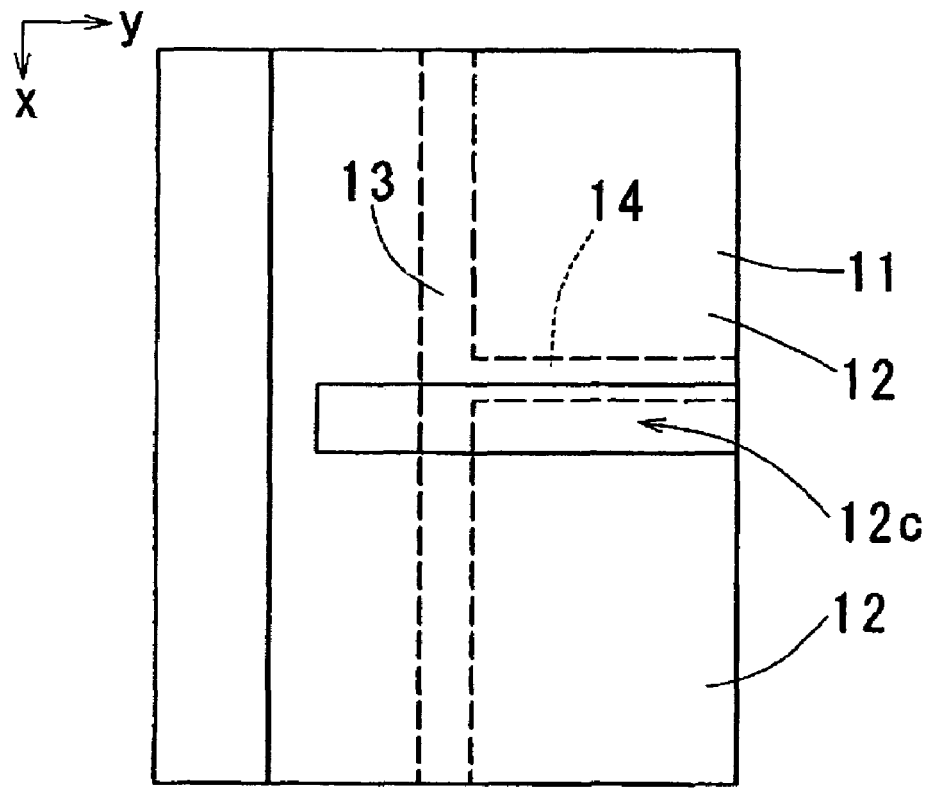
FIG. 13C is a bottom plan view showing a shape of a ground pattern 12.

FIG. 13A is a perspective view showing an example of the 3-terminal circuit 10b. FIG. 13B is a cross sectional view along a longitudinal direction of a signal strip line 13. FIG. 13C is a bottom plan view showing a shape of a ground pattern 12. The 3-terminal circuit 10b includes an electrically insulating board 11 made of dielectric material, a ground pattern 12 located on a bottom face of the board 11, the signal strip line 13 located on a top face of the board 11, and a signal strip line 14 branching laterally from the signal strip line 13. The terminal 21a is connected to one end of the signal strip line 13, and the terminal 21b is connected to one end of the ground pattern 12. The terminal 22a is connected to the other end of the signal strip line 13, and the terminal 22b is connected to the other end of the ground pattern 12. The terminal 23a is connected to the end of the signal strip line 14, and the terminal 23b is connected to the ground pattern 12 closely to the terminal 23a.

As shown in FIG. 13C, a slit 12c is formed across the signal strip line 13 in the ground pattern 12 to constitute a weak ground.

Next, procedure of measuring electric circuit parameters will be described below. As shown in FIG. 12, defining amplitude a1 of incident wave and amplitude b1 of reflected wave at the terminal 21a, and amplitude a2 of incident wave and amplitude b2 of reflected wave at the terminal 22a, and amplitude a3 of incident wave and amplitude b3 of reflected wave at the terminal 23a, S-parameters of the 3-terminal circuit 10b can be expressed by a 3×3 matrix. Relation between incident and reflected waves is given by the following equation (11).

[Formula 6]

$$\begin{pmatrix} b1 \\ b2 \\ b3 \end{pmatrix} = \begin{pmatrix} S11 & S12 & S13 \\ S21 & S22 & S23 \\ S31 & S32 & S33 \end{pmatrix} \begin{pmatrix} a1 \\ a2 \\ a3 \end{pmatrix} \quad (11)$$

In a case of the 3-terminal circuit 10b being configured of passive elements, excluding active elements, such as amplifying device, the following equation (12) is established on account of reversibility of circuit.

[Formula 7]

$$S12=S21, S13=S31, S23=S32 \quad (12)$$

Here, unknown variables to be determined are six elements (S11, S12, S22, S31, S32, S33) in S-matrix. Then, while randomly selecting six combinations out of combinations of terminal impedance ZA of the termination element 34 and terminal impedance ZB of the termination element 35, like in FIG. 1, six reflection characteristics corresponding to these termination conditions are measured, respectively. For example, the termination conditions for termination elements 34 and 35 may be six combinations: (ZA, ZB)=(Z0, infinity) (Z0, zero) (infinity, Z0) (zero, Z0) (Z0, Z0) (zero, zero). Regardless of this, the other combinations may be employed.

As mentioned above, by substituting the six termination conditions and the corresponding six reflection characteristics in equation (12), total six simultaneous equations are obtained. S-parameters having a 3×3 matrix of the 3-terminal circuit 10b can be calculated by solving these simultaneous equations. The resultant S-parameters can be converted into other electric circuit parameters, such as H-parameters, Y-parameters, Z-parameters or the like, using predefined conversion formulas.

Thus, in case of measuring electric circuit parameters of a 3-terminal circuit, the conventional method requires an extremely expensive vector network analyzer for 6 terminals. In this embodiment, a relatively inexpensive vector network analyzer for 2 terminal can be employed, thereby curtailing cost of measurement.

In the above description, method for measuring 3-terminal circuit is exemplified. The present invention also can be applied to a generalized case of N-terminal circuit (N is an integer of two or more). Specifically, S-parameters of N-terminal circuit can be expressed as an N×N matrix, and relation between incident and reflected waves is given by the following equation (13).

[Formula 8]

$$\begin{pmatrix} b1 \\ b2 \\ b3 \\ \vdots \\ \vdots \\ bN \end{pmatrix} = \begin{pmatrix} S11 & S12 & S13 & \ldots & S1N \\ S21 & S22 & S23 & \ldots & S2N \\ S31 & S32 & S33 & \ldots & S3N \\ \ldots & \ldots & \ldots & \ldots & \ldots \\ \ldots & \ldots & \ldots & \ldots & \ldots \\ SN1 & SN2 & SN3 & \ldots & SNN \end{pmatrix} \begin{pmatrix} a1 \\ a2 \\ a3 \\ \vdots \\ \vdots \\ aN \end{pmatrix} \quad (13)$$

In case of the N-terminal circuit being configured of passive elements, unknown variables to be determined are (1+ 2+ . . . +N)=N·(N+1)/2 elements out of the N×N matrix on account of reversibility of circuit.

Accordingly, while changing termination condition for any (N−1) terminals out of N terminals with respect to each of N·(N+1)/2 combinations, each of N·(N+1)/2 reflection characteristics for the one residual terminal is measured. Then, by substituting the N·(N+1)/2 termination conditions and the corresponding N·(N+1)/2 reflection characteristics in equation (13), total N·(N+1)/2 simultaneous equations are obtained. S-parameters having the N×N matrix of the N-terminal circuit can be calculated by solving these simultaneous equations. The resultant S-parameters can be converted into other electric circuit parameters, such as H-parameters, Y-parameters, Z-parameters or the like, using predefined conversion formulas.

Thus, in case of, e.g., a plurality of outputs branching from an LSI or the like, or measuring an electric circuit including a power supply, the number of terminals is increased, hence, the conventional method hardly measure it. But application of the measuring method according to this embodiment facilitates electric circuit parameters to be calculated with high accuracy.

Embodiment 3

Figure 14:
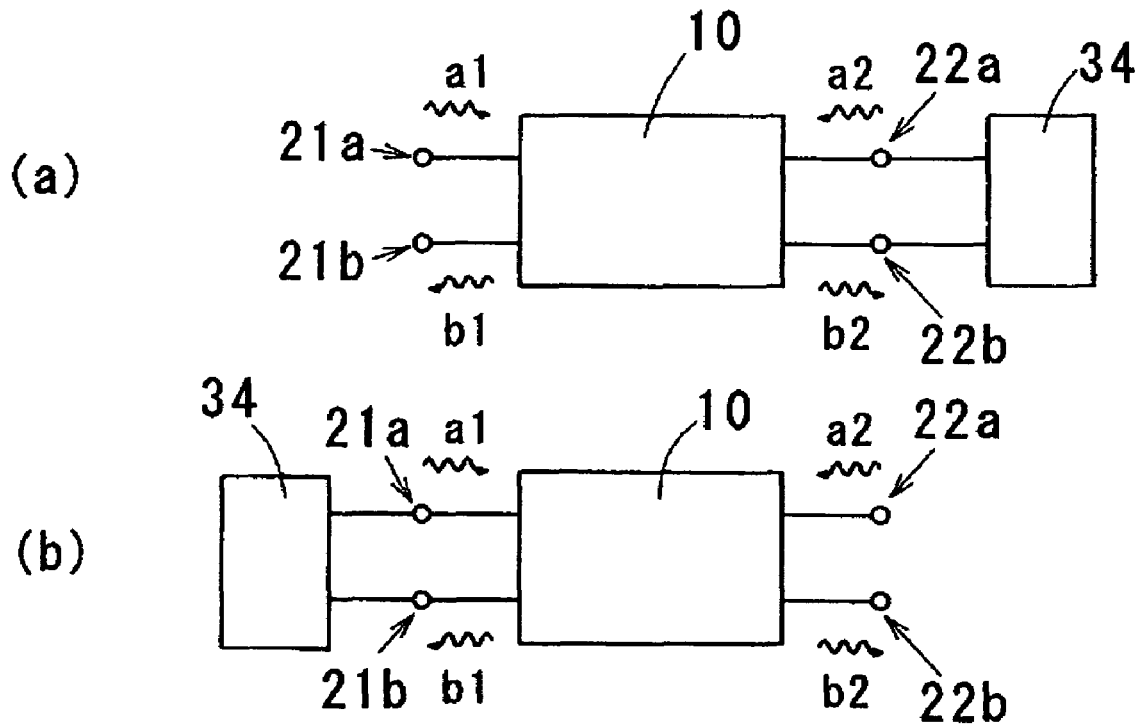
FIG. 14 is a block diagram showing a third embodiment according to the present invention.

FIG. 14 is a block diagram showing a third embodiment according to the present invention. Here, used for DUT is the 2-terminal circuit 10, like in FIG. 1, having a pair of terminals 21a and 21b, and a pair of terminals 22a and 22b, with a difference in that both of the terminals are used for measuring terminals.

In FIG. 14(a), the terminals 21a and 21b of the 2-terminal circuit 10, like in FIG. 1, are connected through a signal cable 41, such as coaxial cable, to a network analyzer 40. The terminals 22a and 22b are selectively connected with a termination element 34 having predetermined impedance. The termination element 34 has impedance of infinity, impedance of zero, characteristic impedance Z0 of the 2-terminal circuit 10, or other finite impedance. The terminal 21b is grounded to keep a ground voltage.

First, the terminals 22a and 22b are connected with the termination element 34 having, e.g., impedance of zero to set up open termination condition. In this condition, the network analyzer 40 supplies the terminals 21a and 21b with the reference signal, and then measures reflection characteristics $\alpha 4$ of the 2-terminal circuit 10, returning from the terminals 21a and 21b.

Next, the terminals 22a and 22b are connected with the termination element 34 having, e.g., characteristic impedance Z0 of the 2-terminal circuit 10 to set up matched termination condition. In this condition, the network analyzer 40 supplies the terminals 21a and 21b with the reference signal, and then measures reflection characteristics $\alpha 5$ of the 2-terminal circuit 10, returning from the terminals 21a and 21b.

Next, as shown in FIG. 14(b), the terminals 21a and 21b are connected with the termination element 34 having, e.g., characteristic impedance Z0 of the 2-terminal circuit 10 to set up matched termination condition. In this condition, the network analyzer 40 supplies the terminals 22a and 22b with the reference signal, and then measures reflection characteristics $\alpha 6$ of the 2-terminal circuit 10, returning from the terminals 22a and 22b.

S-parameters of the 2-terminal circuit 10 is calculated based on the resultant reflection characteristics $\alpha 4$, $\alpha 5$ and $\alpha 6$. As shown in FIG. 14, defining amplitude a1 of incident wave and amplitude b1 of reflected wave at the terminal 21a, and amplitude a2 of incident wave and amplitude b2 of reflected wave at the terminal 22a, S-parameters of the 2-terminal circuit 10 can be expressed by a 2×2 matrix as the above-mentioned equation (1). Relation between incident and reflected waves is given by the above-mentioned equation (2) by using the termination conditions for the respective terminals and the corresponding reflection characteristics $\alpha 4$, $\alpha 5$ and $\alpha 6$, the following equations (14) to (16), like the above-mentioned equations (4) to (6), are obtained.

[Formula 9]

$$S21^2 + (S22+1) \times (\alpha 4 - S11) = 0 \quad (14)$$

$$\alpha 4 = S11 \quad (15)$$

$$\alpha 5 = S22 \quad (16)$$

In case of the 2-terminal circuit 10 being configured of passive elements, S21=S21 is established on account of reversibility of circuit. Since three simultaneous equations can be obtained for three unknown variables, the simultaneous equations can be solved to calculate S-parameters of the 2-terminal circuit 10. The resultant S-parameters of the 2-terminal circuit 10 can be converted into other electric circuit parameters, such as H-parameters, Y-parameters, Z-parameters or the like, using predefined conversion formulas.

Incidentally, in the above-description, each reflection characteristics is measured by changing the termination condition of the 2-terminal circuit in sequence of short-circuit, short-circuit and matched termination condition. But changing of the termination condition may be in random order at any terminals, enough to obtain the three reflection characteristics.

Further, terminal impedance of the termination element 34 is either zero or characteristic impedance in the above-description. But these terminal impedances may be finite and different from each other to calculate electric circuit parameters by calculating simultaneous equations.

Furthermore, in a case where terminal impedance of the termination element 34 is expressed as real part, that is, resistance, substitution of real value of the resistance enables simultaneous equations to be calculated.

More accurate measurement can be performed by using resistor having finite resistance for the termination element 34, instead of impedance of zero or infinity, because, in case of terminal impedance of zero or infinity, a line may act as antenna to generate electromagnetic radiation or affect measurement, or receive external electromagnetic radiation. In this case, used for the terminator is a resistor having, e.g., 10 ohm, 100 ohm, etc. In addition, when using a resistor for the terminator, it is preferable that the inherent properties of the resistor are extracted beforehand in terms of complex value. For example, a cheap chip resistor used for the resistor may have not only real value but also complex value exhibiting inductivity or capacitivity, originating from unwanted impedance parasitic to the chip resistor. The complex value is preferably extracted beforehand to consider it in calculation. This situation is applicable to other embodiments.

Further, in order to determine three unknown variables in the 2-terminal circuit, measurement with three termination conditions is enough on account of reversibility of circuit. But measurement with four or more termination conditions and application of fitting calculation may improve accuracy of measurement.

Arbitrariness of measuring terminals and terminating terminals can be established in a generalized case of N-terminal circuit (N is an integer of two or more). In case of the N-terminal circuit being configured of passive elements, unknown variables to be determined are $(1+2+ \ldots +N) = N \cdot (N+1)/2$ elements out of the N×N matrix on account of reversibility of circuit.

Accordingly, while changing termination condition for any (N−1) terminals out of N terminals with respect to each of $N \cdot (N+1)/2$ combinations, each of $N \cdot (N+1)/2$ reflection characteristics for the one residual terminal is measured. Then, by using the $N \cdot (N+1)/2$ termination conditions and the corresponding $N \cdot (N+1)/2$ reflection characteristics, total $N \cdot (N+1)/2$ simultaneous equations are obtained. S-parameters having the N×N matrix of the N-terminal circuit can be calculated by solving these simultaneous equations.

In the above-described embodiments, measuring object is mainly transmission line, but may be an electric circuit including power and ground lines. For example, when a terminal is located between the power and ground lines, S-parameters for the power and ground lines can be measured. In addition, measurement in condition of a bypass capacitor being appended facilitates evaluation of effect of the bypass capacitor.

Embodiment 4

Figure 15A:
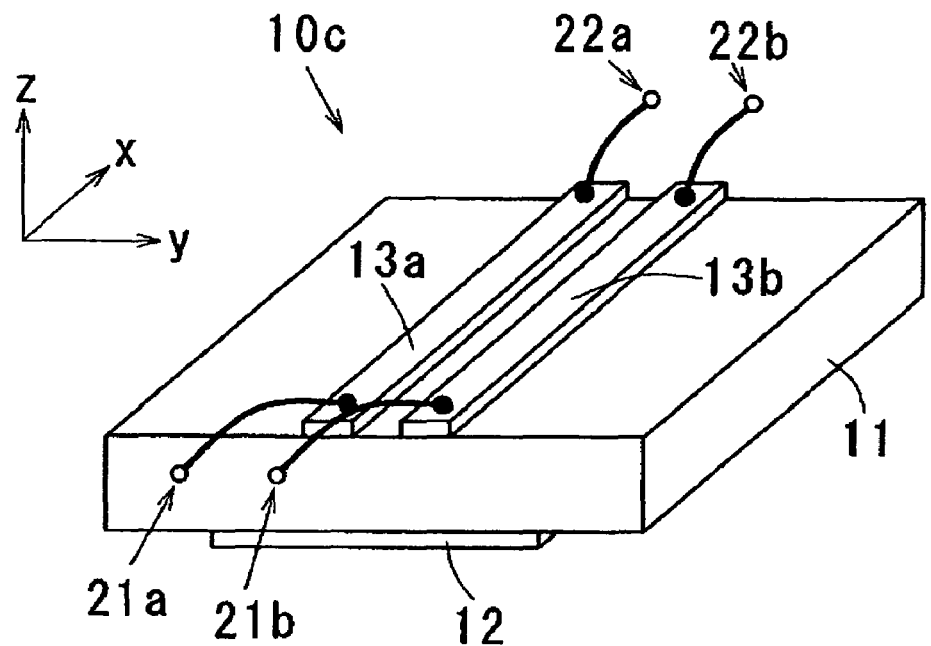
FIG. 15A is a perspective view showing another example of the 2-terminal circuit as DUT.
Figure 15B:
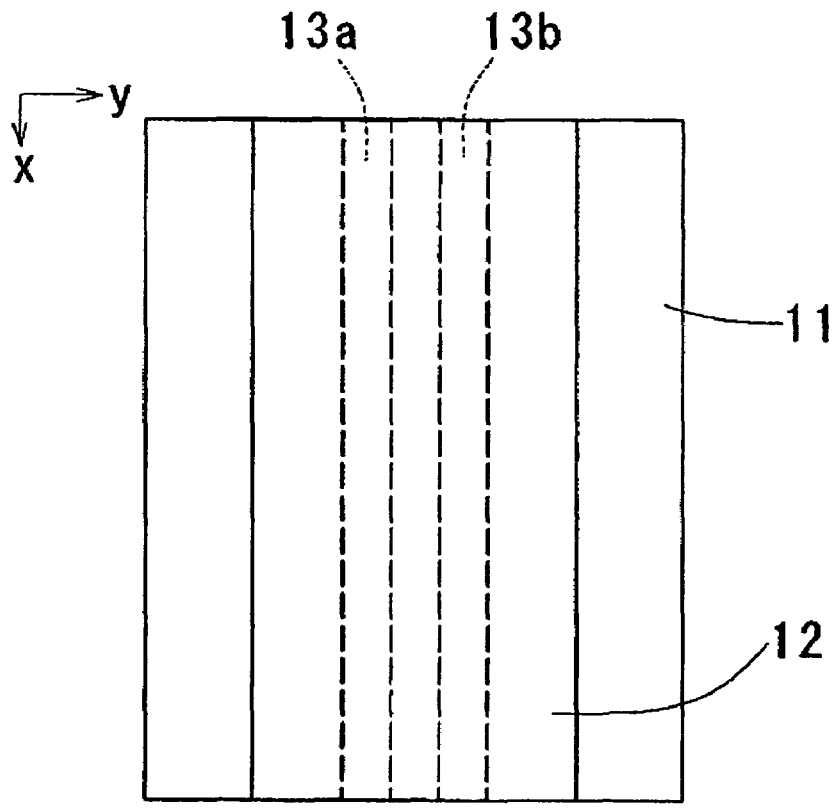
FIG. 15B is a bottom plan view of the 2-terminal circuit in FIG. 15A.

FIG. 15A is a perspective view showing another example of the 2-terminal circuit as DUT. FIG. 15B is a bottom plan view thereof. The 2-terminal circuit 10c includes an electrically insulating board 11 made of dielectric material, a ground pattern 12 located on a bottom face of the board 11, and two signal strip lines 13a and 13b parallel to each other, located on a top face of the board 11, to constitute differential transmission lines having two signal lines and a common ground.

The terminal 21a is connected to one end of the signal strip line 13a, and the terminal 21b is connected to one end of the signal strip line 13b. The terminal 22a is connected to the other end of the signal strip line 13a, and the terminal 22b is connected to the other end of the signal strip line 13b.

Figure 19:
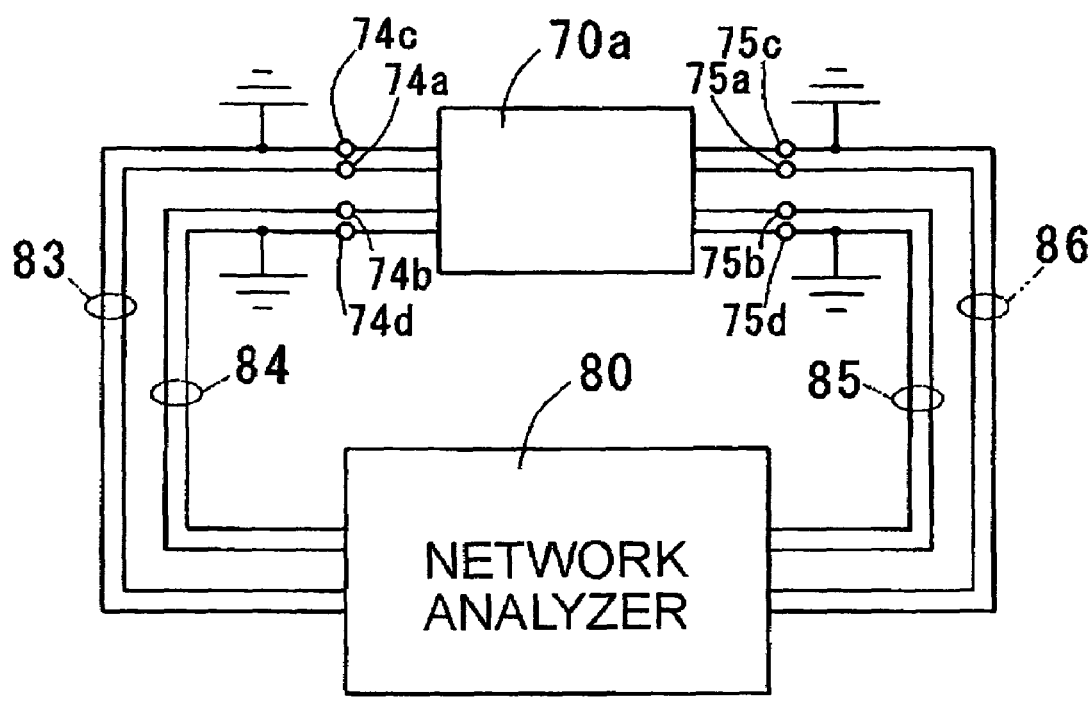
FIG. 19 is a block diagram showing another example of a conventional measurement system for electric circuit parameters.
Figure 20A:
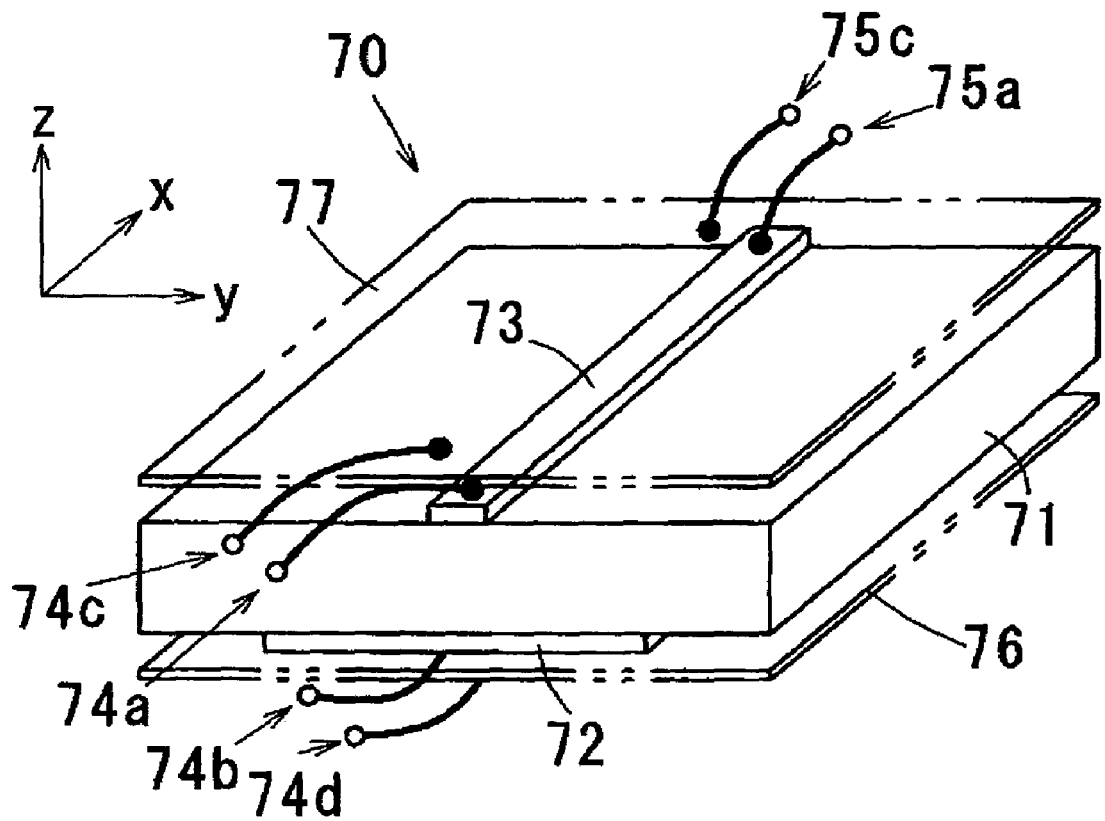
Figure 20B:
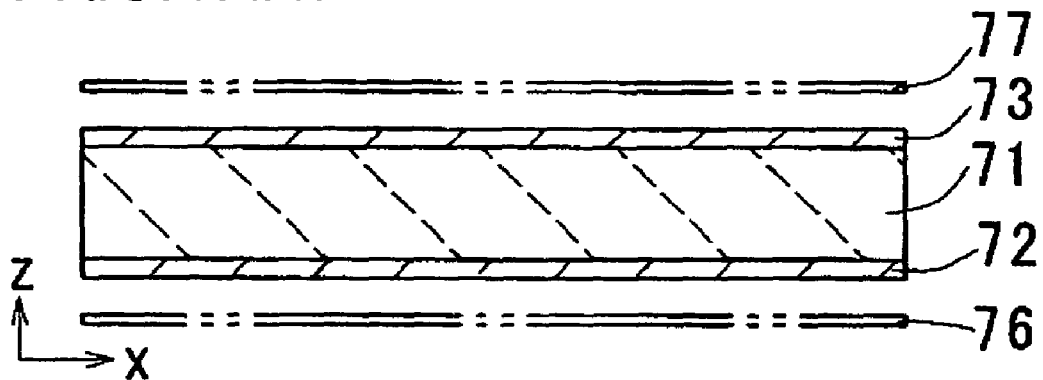
FIG. 20B is a cross sectional view along a longitudinal direction of the signal strip line 73.
Figure 21:
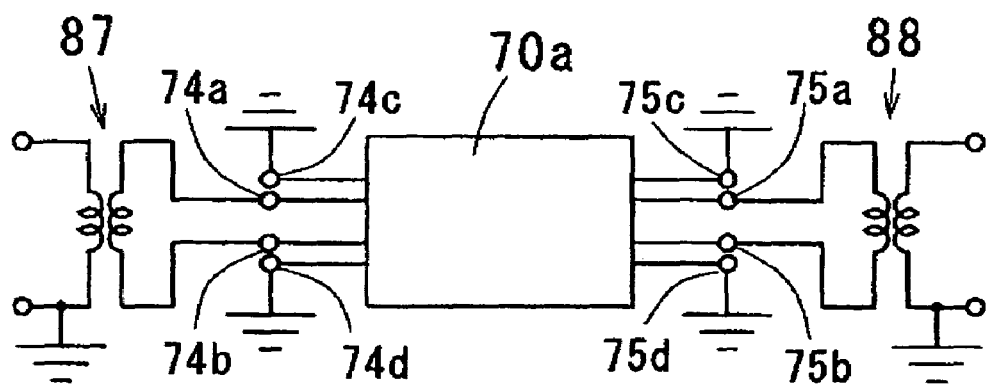
FIG. 21 a circuit diagram showing an example of a converter for converting a 4-terminal circuit into a 2-terminal circuit.
Figure 22:
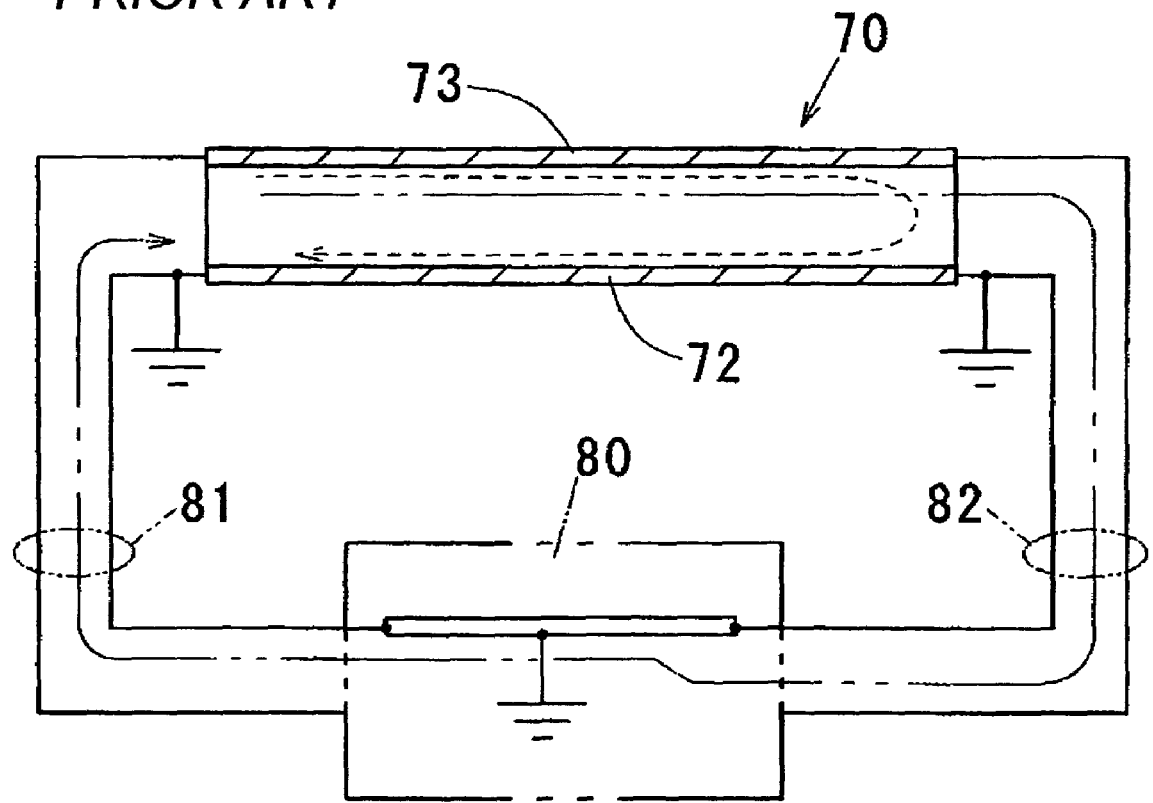
FIG. 22 is an illustrative view showing a current path in the measurement system of FIG. 17.

In such differential transmission lines, the conventional measuring method for 4 terminals, as shown in FIG. 19, is used, or a conventional measuring method for 2 terminals is used in a manner that baluns are located on the input/output sides of the 4-terminal circuit, as shown in FIG. 21, to convert four unbalanced signals into two balanced signals.

For the measuring method according the present invention, just one measuring terminal is sufficient, so that a relatively inexpensive vector network analyzer for 2 terminals can be employed, thereby curtailing cost of measurement. Further, during usual measurement, an additional measuring cable, such as semi-rigid cable, must be connected to the terminal which is connected with a vector network analyzer. Meanwhile, for the measuring method according to the present invention, just one semi-rigid cable is sufficient at the minimum, enabling simple measurement. In comparison with the 2-port measurement with baluns, the present invention can achieve more accurate measurement without influence of the baluns, because it is difficult to accurately extract the electric characteristics of the baluns as well as influence of connection between the balun and the DUT, consequently, accurate measurement cannot performed. Furthermore, usage of baluns means 2-port measurement, which may cause the above-mentioned issue of current path. As a result, in a circuit having a weak ground, only a value containing an error of measurement is obtained.

Embodiment 5

Figure 16:
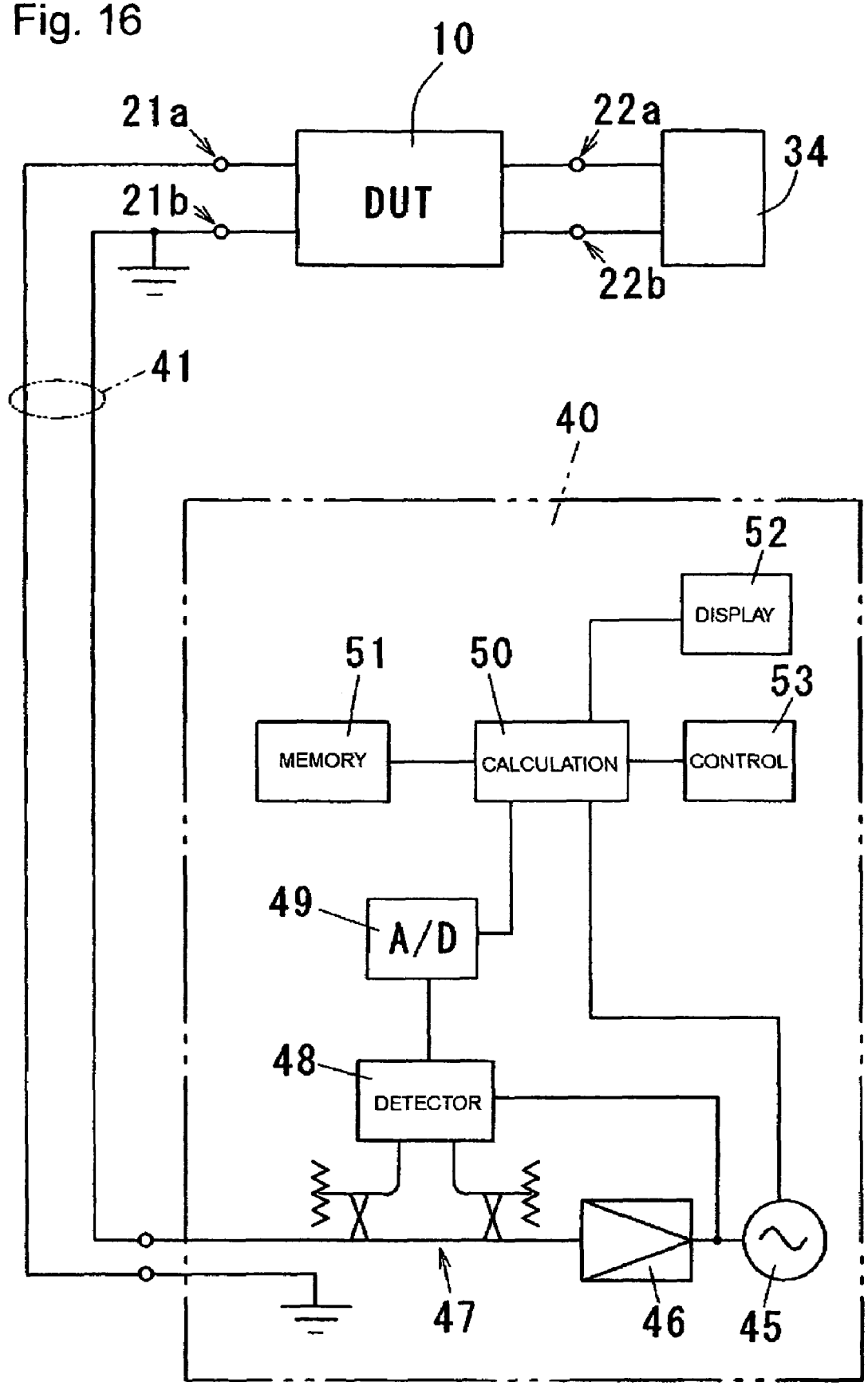
FIG. 16 is a block diagram showing an example of an apparatus for measuring electric circuit parameters, according to the present invention.

FIG. 16 is a block diagram showing an example of an apparatus for measuring electric circuit parameters, according to the present invention. A vector network analyzer 40 includes a reference signal generator 45, an impedance converter 46, a signal cable 41, a directional coupler 47, a heterodyne detector 48, an A/D converter 49, a calculation unit 50, a memory 51, a display unit 52, and a control panel 53.

The reference signal generator 45, which is configured of VCO (voltage controlled oscillator), can generate a reference signal having a predetermined frequency and a predetermined amplitude in response to a control signal from the calculation unit 50. The impedance converter 46 amplifies the reference signal from the reference signal generator 45 to convert it into a transmission signal with a predetermined characteristic impedance of, e.g., 50 ohm to fed into the signal cable 41.

The signal cable 41, which is made of coaxial cable, supplies a DUT with the reference signal from the impedance converter 46.

The directional coupler 47 can branch a signal, which is reflected from the DUT, from the signal cable 41. The heterodyne detector 48 can detects variation of amplitude and variation of phase in the reflected signal with respect to the reference signal by comparing the reflected signal from the directional coupler 47 to reference signal from the reference signal generator 45. The A/D converter 49 converts the output signal from the heterodyne detector 48 into a digital signal to supply it to the calculation unit 50.

The calculation unit 50, which is configured of microprocessor, can execute desired calculation processing and signal control according to predefined programs. The memory 51 stores the programs and various data.

The display unit 52, which is configured of liquid crystal panel or LED array, indicates a display signal of the calculation unit 50 to users. The control panel 53, which is configured of control switch or button, outputs instruction content of users to the calculation unit 50.

Here, used for the DUT is the 2-terminal circuit 10 shown in FIG. 1. The above-described 2-terminal, 3-terminal, N-terminal circuits are also usable.

Next, operation will be described below. First, when user instructs starting of measurement, the calculation unit 50 displays such a message as "Please set up open termination condition." on the display unit 52. The user couples a termination element 34 having impedance of infinity to the terminals 22a and 22b of the 2-terminal circuit 10 to set up open termination condition, and then the user instructs completion of setup using control switch. In this open condition, the network analyzer 40 supplies the terminals 21a and 21b with the reference signal via the signal cable 41. The heterodyne detector 48 measures reflection characteristics $\alpha 1$ of the 2-terminal circuit 10, returning from the terminals 21a and 21b. The measured value is stored in the memory 51 as digital data.

Next, the calculation unit 50 displays such a message as "Please set up short-circuit termination condition." on the display unit 52. The user couples another termination element 34 having impedance of zero to the terminals 22a and 22b of the 2-terminal circuit 10 to set up short-circuit termination condition, and then the user instructs completion of setup using control switch. In this short-circuit condition, the network analyzer 40 supplies the terminals 21a and 21b with the reference signal via the signal cable 41. The heterodyne detector 48 measures reflection characteristics $\alpha 2$ of the 2-terminal circuit 10, returning from the terminals 21a and 21b. The measured value is stored in the memory 51 as digital data.

Next, the calculation unit 50 displays such a message as "Please set up matched termination condition." on the display unit 52. The user couples the other termination element 34 having characteristic impedance Z0 to the terminals 22a and 22b of the 2-terminal circuit 10 to set up matched termination condition, and then the user instructs completion of setup using control switch. In this matched condition, the network analyzer 40 supplies the terminals 21a and 21b with the reference signal via the signal cable 41. The heterodyne detector 48 measures reflection characteristics $\alpha 3$ of the 2-terminal circuit 10, returning from the terminals 21a and 21b. The measured value is stored in the memory 51 as digital data.

The calculation unit 50 can solve the above-mentioned simultaneous equations based on the resultant reflection characteristics $\alpha 1$, $\alpha 2$ and $\alpha 3$ to calculate S-parameters of the 2-terminal circuit 10. The result of calculation can be displayed on the display unit 52, or printed by a printer (not shown), or transmitted externally via a local area network or the like.

Incidentally, the termination element 34 may have internal electric switches for automatically switching three types of terminators, thereby enabling automated measurement. For the electric switches, e.g., PIN diodes or FET switches made of GaAs or the like can be used.

In addition to this case, the termination element 34 may be built in the measurement apparatus, thereby further simplifying the measurement system. In this case, the measurement apparatus has at least two terminals for measuring terminal and termination terminal, provided that the ground connected to the measuring terminal is electrically isolated from the ground connected to the termination terminal.

Further, terminal of the measurement apparatus may alternately function as either the measuring terminal or the termination terminal, thereby enabling measurement for any port without alternating coupling of cables, provided that the ground connected to the measuring terminal is electrically isolated from the ground connected to the termination terminal. For alternating function, the above-mentioned electric switches are usable.

In the above-described measurement apparatus, in a case where the termination element 34 cannot be directly connected to the DUT, a cable may be used, in which impedance of the cable is considered in calculation. For example, the termination element 34 built in the measurement apparatus corresponds to this case.

In the above description, usage of the 2-terminal circuit 10 shown in FIG. 1 is exemplified. The present invention also can be applied to a generalized case of N-terminal circuit (N is an integer of two or more). S-parameters of N-terminal circuit can be expressed as an N×N matrix.

Accordingly, while changing termination condition for any (N−1) terminals out of N terminals with respect to each of N·(N+1)/2 combinations, each of N·(N+1)/2 reflection characteristics for the one residual terminal is measured and stored in the memory 51. Then, the calculation unit 50 utilizes the N·(N+1)/2 termination conditions and the corresponding N·(N+1)/2 reflection characteristics to obtain total N·(N+1)/2 simultaneous equations, and solves these simultaneous equations to calculate S-parameters having the N×N matrix of the N-terminal circuit. The resultant S-parameters can be converted into other electric circuit parameters, such as H-parameters, Y-parameters, Z-parameters or the like, using predefined conversion formulas.

Even in case of the DUT being N-terminal circuit, just one measuring terminal is sufficient, thereby simplifying constitution of the network analyzer 40 and curtailing cost of measurement.

The present invention is very industrially useful in that electric circuit parameters, such as S-parameters, Z-parameters or the like, even of a DUT having a weak ground, can be measured in a simple way with high accuracy and low cost.

The invention claimed is:

1. A method for measuring reciprocal electric circuit parameters of an N-terminal circuit (N is an integer of two or more) having first to N-th terminals, including steps of:
    changing termination condition for any (N−1) terminals out of N terminals with respect to each of N·(N+1)/2 combinations, to measure each of N·(N+1)/2 reflection characteristics for the one residual terminal which is connected with a calibrated measuring terminal; and
    calculating, using a processor, electric circuit parameters of the N-terminal circuit under test, based on the resultant reflection characteristics,
    wherein a terminator which terminates each of any (N−1) terminals includes a resistor having a resistance other than the characteristic impedance.

2. A method for measuring reciprocal electric circuit parameters of an N-terminal circuit (N is an integer of two or more) having first to N-th terminals, including steps of:
    changing termination condition for any (N−1) terminals out of N terminals with respect to each of N·(N+1)/2 combinations, to measure each of N·(N+1)/2 reflection characteristics for the one residual terminal which is connected with a calibrated measuring terminal;
    calculating, using a processor, electric circuit parameters of the N-terminal circuit under test, based on the resultant reflection characteristics; and
    calculating for correcting imaginary component of impedance of the terminator.

* * * * *